United States Patent
Yoshida et al.

(10) Patent No.: US 10,658,360 B2
(45) Date of Patent: May 19, 2020

(54) SEMICONDUCTOR DEVICE WITH AN INSULATED-GATE BIPOLAR TRANSISTOR REGION AND A DIODE REGION

(71) Applicants: FUJI ELECTRIC CO., LTD., Kawasaki-shi, Kanagawa (JP); DENSO CORPORATION, Kariya-shi, Aichi (JP)

(72) Inventors: Souichi Yoshida, Matsumoto (JP); Masaki Tamura, Shiojiri (JP); Kenji Kouno, Kariya (JP); Hiromitsu Tanabe, Kariya (JP)

(73) Assignees: FUJI ELECTRIC CO., LTD., Kawasaki-Shi, Kanagawa (JP); DENSO CORPORATION, Kariya, Aichi (JP)

(*) Notice: Subject to any disclaimer, the term of this patent is extended or adjusted under 35 U.S.C. 154(b) by 116 days.

(21) Appl. No.: 15/791,760

(22) Filed: Oct. 24, 2017

(65) Prior Publication Data

US 2018/0047725 A1    Feb. 15, 2018

Related U.S. Application Data

(63) Continuation of application No. PCT/JP2016/067457, filed on Jun. 10, 2016.

(30) Foreign Application Priority Data

Jun. 17, 2015   (JP) ................ 2015-122470

(51) Int. Cl.
    *H01L 29/66*    (2006.01)
    *H01L 27/07*    (2006.01)
    (Continued)

(52) U.S. Cl.
    CPC ...... *H01L 27/0755* (2013.01); *H01L 21/8249* (2013.01); *H01L 27/0716* (2013.01);
    (Continued)

(58) Field of Classification Search
    CPC ............ H01L 27/0716; H01L 27/0727; H01L 27/0652; H01L 27/0664; H01L 27/0761;
    (Continued)

(56) References Cited

U.S. PATENT DOCUMENTS

| 2005/0017290 | A1* | 1/2005 | Takahashi | H01L 29/0696 257/328 |
| 2005/0045960 | A1  | 3/2005 | Takahashi | |
| 2009/0001411 | A1* | 1/2009 | Tokura    | H01L 27/0664 257/140 |

(Continued)

FOREIGN PATENT DOCUMENTS

| JP | 2005-101514 A | 4/2005 |
| JP | 2007-227982 A | 9/2007 |

(Continued)

*Primary Examiner* — Ismail A Muse
(74) *Attorney, Agent, or Firm* — Rabin & Berdo, P.C.

(57) ABSTRACT

On a front surface side of an n⁻ semiconductor substrate, an emitter electrode and trench gates each including a p base layer, a trench, a gate oxide film and a gate electrode are provided in an IGBT region and a FWD region. Among p base layers each between adjacent trenches, p base layers having an n⁺ emitter region are the IGBT emitter region and the p base layers not having the n⁺ emitter region are the FWD anode region. A lateral width of an n⁺ cathode region is narrower than a lateral width of the FWD anode region. A difference of a lateral width of the FWD anode region and a lateral width of the n⁺ cathode region is 50 μm or more. Thus, a semiconductor device may be provided that reduces the forward voltage drop while suppressing waveform oscillation during reverse recovery and having soft recover characteristics.

3 Claims, 17 Drawing Sheets

(51) Int. Cl.
- *H01L 29/32* (2006.01)
- *H01L 29/861* (2006.01)
- *H01L 29/08* (2006.01)
- *H01L 21/8249* (2006.01)
- *H01L 29/739* (2006.01)
- *H01L 29/40* (2006.01)
- *H01L 49/02* (2006.01)
- *H01L 29/06* (2006.01)

(52) U.S. Cl.
CPC ........ *H01L 27/0727* (2013.01); *H01L 29/083* (2013.01); *H01L 29/0834* (2013.01); *H01L 29/32* (2013.01); *H01L 29/7397* (2013.01); *H01L 29/8613* (2013.01); *H01L 28/20* (2013.01); *H01L 29/0696* (2013.01); *H01L 29/407* (2013.01); *H01L 29/8611* (2013.01)

(58) Field of Classification Search
CPC ........... H01L 27/0755; H01L 29/66348; H01L 29/7397; H01L 29/0834
See application file for complete search history.

(56) References Cited

U.S. PATENT DOCUMENTS

| | | | |
|---|---|---|---|
| 2010/0156506 A1* | 6/2010 | Tsuzuki | H01L 27/0664 327/478 |
| 2012/0043582 A1 | 2/2012 | Koyama et al. | |
| 2012/0132954 A1* | 5/2012 | Kouno | H01L 29/0619 257/140 |
| 2013/0009206 A1* | 1/2013 | Soeno | H01L 29/7397 257/140 |
| 2013/0087829 A1* | 4/2013 | Tanabe | H01L 29/66348 257/140 |
| 2014/0070266 A1 | 3/2014 | Matsudai et al. | |
| 2014/0361333 A1 | 12/2014 | Kimura et al. | |
| 2016/0141400 A1* | 5/2016 | Takahashi | H01L 29/7397 257/140 |
| 2016/0247808 A1 | 8/2016 | Horiuchi et al. | |
| 2016/0329323 A1* | 11/2016 | Iwasaki | H01L 29/32 |
| 2016/0351561 A1* | 12/2016 | Senoo | H01L 29/872 |
| 2017/0162560 A1* | 6/2017 | Takahashi | H01L 29/78 |
| 2017/0263603 A1* | 9/2017 | Hata | H01L 29/7397 |

FOREIGN PATENT DOCUMENTS

| | | |
|---|---|---|
| JP | 2008-192737 A | 8/2008 |
| JP | 2012-043891 A | 3/2012 |
| JP | 2013-152996 A | 8/2013 |
| JP | 2014-056942 A | 3/2014 |
| WO | WO-2015/068203 A1 | 5/2015 |

\* cited by examiner

SEMICONDUCTOR DEVICE WITH AN INSULATED-GATE BIPOLAR TRANSISTOR REGION AND A DIODE REGION

CROSS REFERENCE TO RELATED APPLICATIONS

This is a continuation application of International Application PCT/JP2016/067457 filed on Jun. 10, 2016 which claims priority from a Japanese Patent Application No. 2015-122470 filed on Jun. 17, 2015, the contents of which are incorporated herein by reference.

BACKGROUND OF THE INVENTION

1. Field of the Invention

Embodiments of the invention relate to a semiconductor device.

2. Description of the Related Art

Performance improvements of 600V, 1200V, and 1700V power semiconductor devices such as insulated gate bipolar transistors (IGBTs) and freewheeling diodes (FWDs) are advancing. Power semiconductor devices are used in power converting equipment such as inverters that achieve power savings and high efficiency and are necessary in motor control. There is rapid market demand concerning various characteristics of power semiconductor devices used for such applications, such as reduced loss (power savings), high-speed with high-efficiency, and environmental friendliness.

As a method of manufacturing a power semiconductor device meeting such demands, a method that manufactures an IGBT that is low cost and has low electrical loss such low ON voltage has been proposed. In particular, first, to prevent wafer cracking during wafer processing, wafer processing begins with an ordinarily adopted wafer that is thick. In the latter half of processing, the rear surface of the wafer is ground as much as possible to an extent that still enables desired characteristics to be obtained. Thereafter, from the ground rear surface of the wafer, an impurity is ion implanted to a desired impurity concentration and activated, forming a $p^+$ collector region.

Recently, methods of manufacturing a low-cost semiconductor device having low electrical loss by reducing the thickness of such a wafer, in particular, have become mainstream methods of developing and manufacturing power semiconductor devices. Further, a method of ion implanting an impurity from a ground rear surface of a wafer to form on a collector side of an $n^-$ drift layer, a field stop (FS) layer that suppresses the spread of a depletion layer from a pn junction between a p base layer and the $n^-$ drift layer from reaching a $p^+$ collector region in an OFF state has become indispensable as a method of manufacturing a low-loss IGBT.

Further, to facilitate reductions in the overall size of power converting equipment, development of reverse conducting IGBTs (RC-IGBTs) having an integrated structure in which an IGBT and a freewheeling diode (FWD) connected in reverse parallel to the IGBT are built on a single semiconductor chip is advancing. A case in which an IGBT (FS-IGBT) having an FS layer and a FWD connected in reverse parallel to the FS-IGBT are built and integrated on a single semiconductor chip will be described as an example of a configuration of a conventional RC-IGBT. FIG. 16 is a cross-sectional view of a configuration of a conventional RC-IGBT having a FS structure.

As depicted in FIG. 16, in the conventional RC-IGBT, a trench-gate-type MOS gate (insulated gate having a metal oxide film semiconductor) structure 120 that includes a p base layer 102, a trench 103, a gate oxide film 104, a gate electrode 105, an $n^+$ emitter region 106, and a $p^+$ contact region 107 is provided on a front surface side of an $n^-$ semiconductor substrate, in an IGBT region 121. An emitter electrode 108 contacts the $n^+$ emitter region 106 and the $p^+$ contact region 107. Reference numeral 109 represents an interlayer insulating film.

The p base layer 102, the trench 103, the emitter electrode 108, and the interlayer insulating film 109 are provided in the IGBT region 121 and in a FWD region 122. In the FWD region 122, the p base layer 102 serves as a p anode layer of the FWD and the emitter electrode 108 serves as an anode electrode. In an $n^-$ drift layer 101, an n field stop (FS) layer 110 is provided on a rear surface of the $n^-$ semiconductor substrate in the IGBT region 121 and the FWD region 122.

In a rear surface side of the $n^-$ semiconductor substrate, a $p^+$ collector region 111 is provided in the IGBT region 121. Further, in the rear surface side of the $n^-$ semiconductor substrate, an $n^+$ cathode region 112 is provided in the FWD region 122. Among the p base layers 102 between the trenches 103, the $p^+$ collector region 111 faces, across the $n^-$ drift layer 101, the p base layers 102 that have the $n^+$ emitter region 106 and are in an IGBT emitter region 131. The $n^+$ cathode region 112 is provided in parallel with the $p^+$ collector region 111 in a horizontal direction on a rear surface of the $n^-$ semiconductor substrate.

Further, among the p base layers 102 between the trenches 103, the $n^+$ cathode region 112 faces, across the $n^-$ drift layer 101, the p base layers 102 that do not have the $n^+$ emitter region 106, function as an anode, and are in a FWD anode region 132. A collector electrode 113 also serves as a cathode electrode and contacts the $p^+$ collector region 111 and the $n^+$ cathode region 112. The $n^+$ cathode region 112 and the FWD anode region 132 typically have the same surface area.

A device in which for each IGBT cell, a well-shaped P base layer is formed and at a portion on a rear surface side directly beneath the P base layer, a collector $P^+$ layer and a cathode $N^+$ layer are formed has been proposed as another RC-IGBT (e.g., refer to Japanese Laid-Open Patent Publication No. 2005-101514). In Japanese Laid-Open Patent Publication No. 2005-101514, a collector short type is described in which on a front surface of a semiconductor chip, only a MOS gate structure is arranged by a pattern identical to that of an ordinary IGBT and on a rear surface of the semiconductor chip, a $p^+$ collector region of an IGBT region and an $n^+$ cathode region of a FWD region are arranged in parallel.

A device in which no MOS gate structure is provided in a diode region, includes a diode-dedicated region and a diode configured to have a p-intrinsic-n (pin) structure or a merged p-i-n/Schottky (MPS) structure has been proposed as another RC-IGBT (e.g., refer to Japanese Laid-Open Patent Publication No. 2008-192737).

The following device in which an IGBT region and a FWD region are formed on a single semiconductor chip has been proposed as another RC-IGBT.

In the device, in the FWD region, an end on the IGBT region side of a cathode region is separated from an end on the IGBT region side of an anode layer by 100 µm or more in a direction away from the IGBT region (e.g., refer to Japanese Laid-Open Patent Publication No. 2007-227982

(paragraph 0094, FIG. 16)). Further, a device having a MOS gate structure of an IGBT region configured as a trench gate structure has been proposed as another RC-IGBT (e.g., refer to Japanese Laid-Open Patent Publication No. 2012-043891).

SUMMARY OF THE INVENTION

According to one aspect of the present invention, a semiconductor device includes an insulated-gate bipolar transistor region and a freewheeling diode region on a substrate having a drift layer of a first conductivity type. The insulated-gate bipolar transistor region includes: a base layer of a second conductivity type provided on a front surface side of the semiconductor substrate; an emitter region of the first conductivity type selectively provided in the base layer; a first insulated gate region including a first gate insulating film and a first gate electrode, provided on the front surface side of the semiconductor substrate; an emitter electrode electrically connected to both the base layer and the emitter region; a collector region of the second conductivity type selectively provided in a rear side of the semiconductor substrate; and a collector electrode electrically connected to the collector region. The freewheeling diode region includes: an anode layer of the second conductivity type provided on the front surface side of the semiconductor substrate, electrically connected to the emitter electrode; a second insulated gate region including a first trench penetrating the anode layer and reaching the drift layer, a second gate insulating film provided along an inner wall of the first trench, and a second gate electrode provided in the first trench, via a second gate insulating film; and a cathode region of the first conductivity type provided in the rear side of the semiconductor substrate, electrically connected to the collector electrode. A width of the cathode region in a first direction in which the insulated-gate bipolar transistor region and the freewheeling diode region are arranged is narrower than a width of the anode layer in the first direction.

In the semiconductor device, a difference of the width of the anode layer in the first direction and the width of the cathode region in the first direction is 50 μm or more.

In the semiconductor device, a width of the cathode region in a second direction orthogonal to the first direction is narrower than a width of the anode layer in the second direction.

In the semiconductor device, the first insulated gate region includes: a second trench penetrating the base layer and the emitter region, reaching the drift layer; the first gate insulating film provided along an inner wall of the second trench; and the first gate electrode provided in the second trench via the first gate insulating film.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
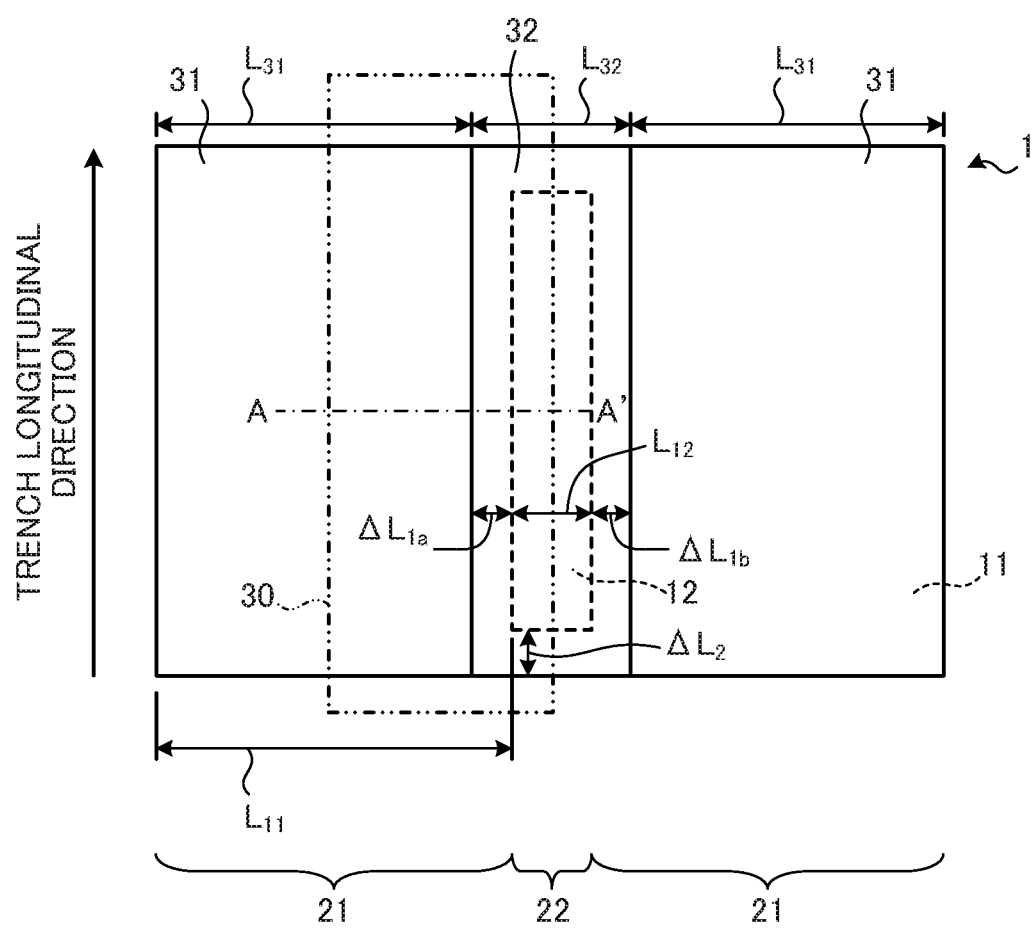
FIG. 1 is a plan view of a configuration of a semiconductor device according to an embodiment.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 15:
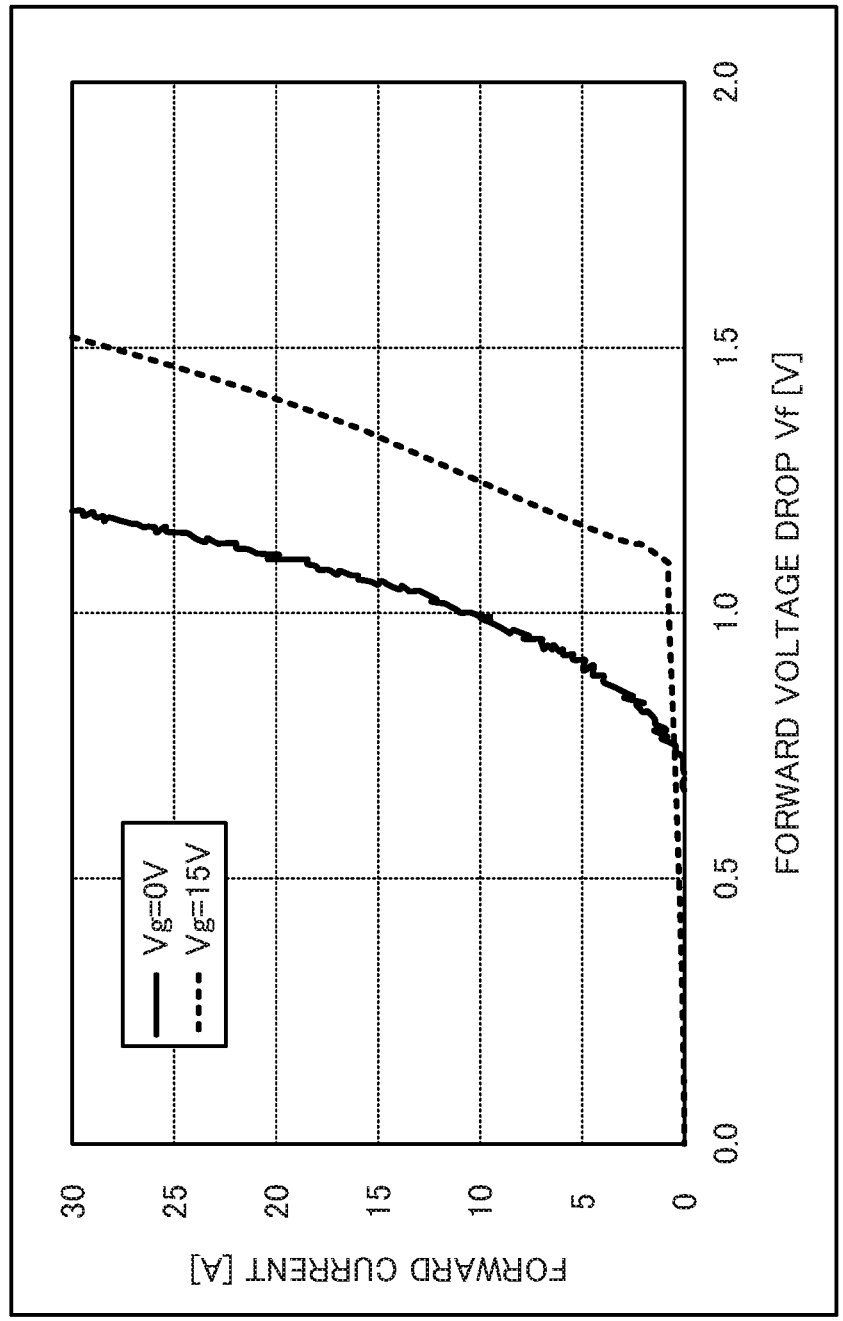
FIG. 15 is a characteristics diagram of forward voltage drop characteristics of a conventional RC-IGBT.

From the results of earnest research by the inventors, the following problems were found occur in the described conventional RC-IGBT in which the IGBT and the FWD are integrated on a single semiconductor substrate. FIG. 15 is a characteristics diagram of forward voltage drop characteristics of the conventional RC-IGBT. In the conventional RC-IGBT, during reverse bias (when voltage is applied to the emitter electrode 108), the FWD of the FWD region 122 operates. On the other hand, during forward bias (when voltage is applied to the collector electrode 113), for example, the threshold voltage 15V is applied to the gate electrode 105 whereby the IGBT of the IGBT region 121 is in the ON state (gate voltage Vg=15V).

Figure 16:
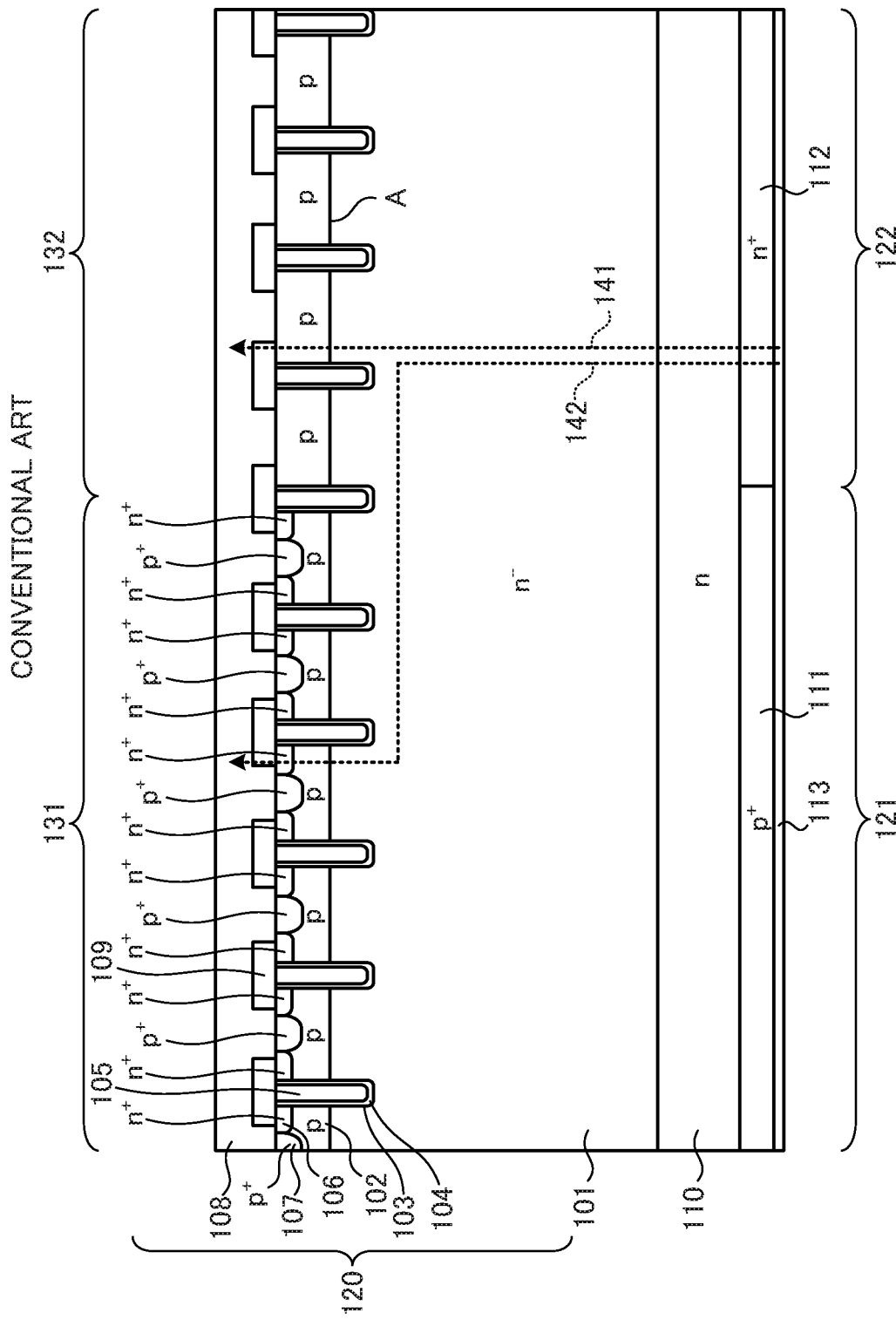
FIG. 16 is a cross-sectional view of a configuration of a conventional RC-IGBT having a FS structure.

When the FWD operates while the IGBT is in the OFF state (gate voltage Vg=0), electrons injected from the n$^+$ cathode region 112 into the n$^-$ drift layer 101 flow into the p anode layer (the FWD anode region 132) (arrow indicated by reference numeral 141 in FIG. 16). On the other hand, when the FWD operates while the IGBT is in the ON state, the n$^+$ cathode region 112 of the FWD and the n$^+$ emitter region 106 of the IGBT short due to an n-type inversion layer (n channel) formed in the p base layer 102 of the IGBT region 121 consequent to the IGBT region 121 and the FWD region 122 being formed together. In other words, the n$^+$ emitter region 106 of the IGBT region 121 also functions as an anode in a broad sense.

As a result, electrons injected from the n$^+$ cathode region 112 into the n$^-$ drift layer 101 pass through the n$^+$ emitter region 106 via the n-type inversion layer (n channel, not depicted) of IGBT and exit from the emitter electrode 108 (arrow indicated by reference numeral 142 in FIG. 16). Since the carrier (electron) density is high ($1\times10^{17}$/cm$^3$ or higher) in the n-type inversion layer and the n+ emitter region 106 (electron path) adjacent to the p base layer 102, it is difficult for the voltage drop of this portion of the electron path to become the built-in voltage (~0.7V) of a pn junction (hereinafter, pn junction A) between the p anode layer and the n− drift layer 101, or higher. As a result, as depicted in FIG. 15, until the voltage drop due to electron mobility exceeds the built-in voltage of the pn junction A, it is difficult for the potential of the p anode layer to become the built-in voltage of the pn junction A or higher whereby the forward voltage drop Vf of the FWD increases causing snapping (jumping) in the voltage-current curve (I-V curve) to occur. Such a problem also similarly occurs when as in Japanese Laid-Open Patent Publication No. 2005-101514, the FWD region 122 is set as a diode-dedicated region. When the forward voltage drop Vf of the FWD increases, for example, a problem arises in that electrical loss occurs in an inverter equipped with a RC-IGBT.

Figure 2:
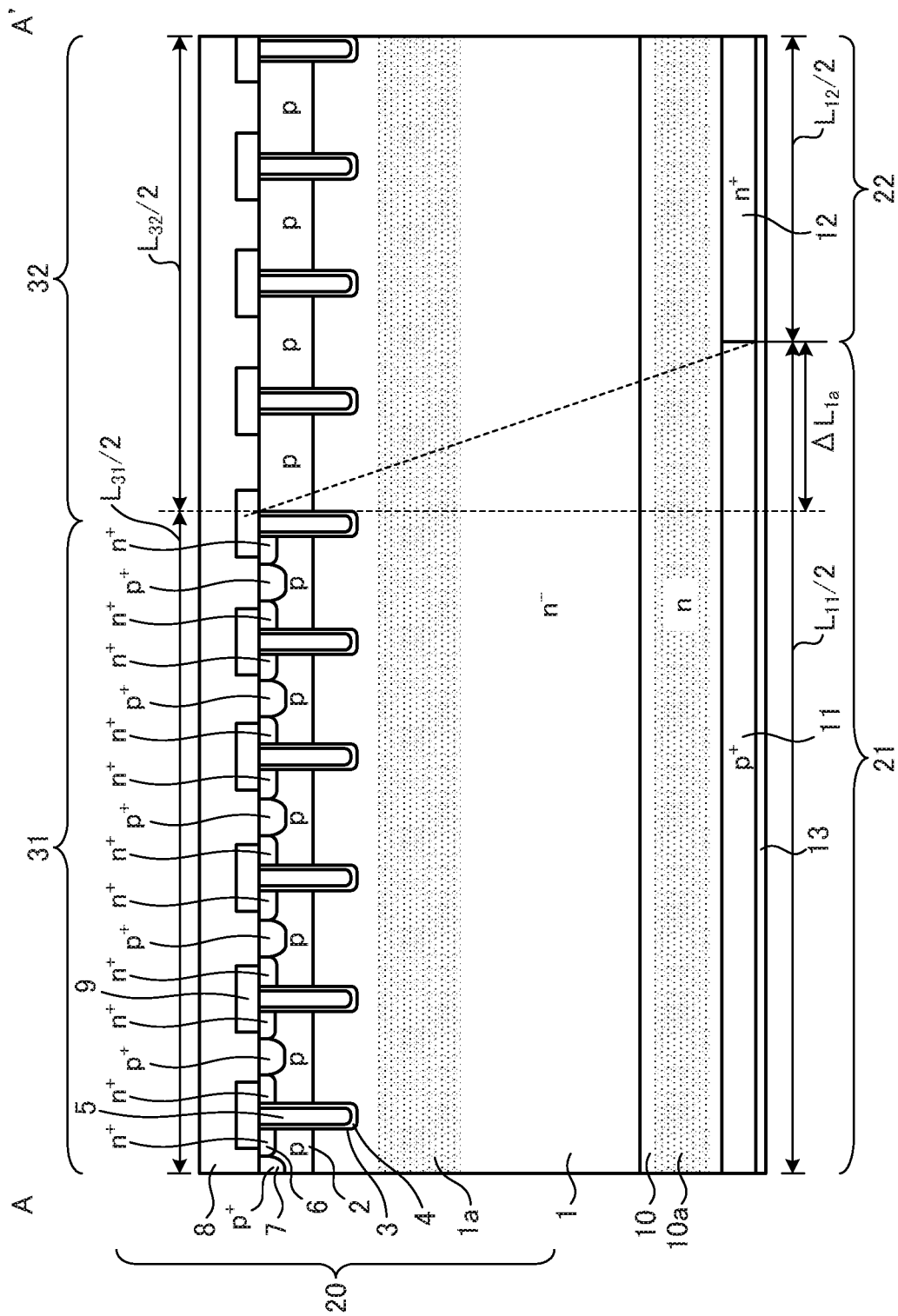
FIG. 2 is a cross-sectional view along cutting line A-A' in FIG. 1.

A configuration of a semiconductor device according to the embodiment is described. FIG. 1 is a plan view of a configuration of the semiconductor device according to the embodiment. FIG. 2 is a cross-sectional view along cutting line A-A' in FIG. 1. As depicted in FIGS. 1 and 2, the semiconductor device according to the embodiment includes on a single n− semiconductor substrate (semiconductor chip) that becomes an n− drift layer 1, an IGBT region 21 in which an IGBT is provided and a FWD region 22 in which a freewheeling diode (FWD) is provided.

In particular, the semiconductor device according to the embodiment is a reverse conducting IGBT (RC-IGBT) in which the FWD in the FWD region 22 is connected in reverse parallel to the IGBT in the IGBT region 21. The IGBT in the IGBT region 21 is, for example, a trench gate IGBT and in a front surface of the n− semiconductor substrate, plural trench gates (insulated gate region) are provided in the IGBT region 21 and the FWD region 22. The plural trench gates have a striped planar layout extending in a direction (hereinafter, a trench longitudinal direction (second direction)) orthogonal to a direction (hereinafter, a trench lateral direction (first direction)) along which trenches 3 are arranged.

The IGBT region 21 and the FWD region 22 are established together in the trench lateral direction. In particular, the FWD region 22 is between two of the IGBT regions 21 adjacent in the trench lateral direction. At a central portion of the n− semiconductor substrate, an active region (not depicted) in which current flows in an ON state is provided in the IGBT region 21 and the FWD region 22. An edge termination region (not depicted) that mitigates electric field of a substrate front side of the n− drift layer 1 and maintains the breakdown voltage is provided at the periphery of the active region. The edge termination region is constituted by, for example, a p+ region such as a guard ring or a metal film such as a field plate.

In FIG. 1, a planar layout of an IGBT emitter region 31, a FWD anode region 32, a p+ collector region 11, and an n+ cathode region 12 as viewed from a front surface side of an n− semiconductor substrate is depicted. The IGBT emitter region 31 and the FWD anode region 32 will be described hereinafter. FIG. 2 depicts a cross-sectional view of a portion (portion surrounded by a frame 30) including a half of one of the IGBT regions 21 adjacent to the FWD region 22 (the half facing the FWD region 22) and a half of the FWD region 22 (the half facing the IGBT region 21), at a cutting line A-A'. Hereinafter, an element structure of the IGBT and the FWD in the active region will be described in detail.

In the IGBT region 21, on the front surface side of the n− semiconductor substrate, a trench-gate-type MOS gate (insulated gate having a metal oxide film semiconductor) structure 20 is provided. The MOS gate structure 20 is constituted by a p base layer 2, the trenches 3, a gate oxide film 4, a gate electrode 5, an n+ emitter region 6, and a p+ contact region 7. The p base layer 2 is provided on a surface layer on the front surface of the n− semiconductor substrate. Each of the trenches 3 penetrates the p base layer 2 and reaches the n− drift layer 1. Further, the trenches 3 are provided at predetermined intervals in the IGBT region 21 and the FWD region 22.

In each of the trenches 3, the gate oxide film 4 is provided along sidewalls and a bottom of the trench 3. Further, in each of the trenches 3, the gate electrode 5 containing, for example, poly-silicon is provided on the gate oxide film 4. The n+ emitter region 6 and the p+ contact region 7 are selectively formed in the p base layer 2. Each n+ emitter region 6 contacts a sidewall of a trench 3 and faces the gate electrode 5 across the gate oxide film 4. An emitter electrode 8 contacts the n+ emitter regions 6 and the p+ contact regions 7 and is electrically insulated from each gate electrode 5 by an interlayer insulating film 9.

The p base layer 2, the trenches 3, the emitter electrode 8, and the interlayer insulating films 9 are provided in the IGBT region 21 and the FWD region 22. Further, the n+ emitter region 6 and the p+ contact region 7 are not provided in a portion of the IGBT region 21 near the FWD region 22 and are not provided in the FWD region 22. Among the p base layers 2 between adjacent trenches 3, the p base layers 2 having the n+ emitter region 6 function as an emitter. Hereinafter, a region having the p base layers 2 functioning as an emitter is regarded as the IGBT emitter region 31.

Further, among the p base layers 2 between adjacent trenches 3, the p base layers 2 not having an n+ emitter region 6 function as an anode. Hereinafter, a region having the p base layers 2 functioning as an anode is regarded as the FWD anode region 32. In other words, in the FWD anode region 32, similar to the IGBT emitter region 31, a trench gate constituted by the p base layer 2, the trench 3, the gate oxide film 4 and the gate electrode 5, and the emitter electrode 8 are provided while the n+ emitter region 6 and the p+ contact region 7 are omitted. In the FWD anode region 32, the emitter electrode 8 serves as an anode electrode. The reason a trench gate is formed in the FWD anode region 32 is explained hereinafter.

In the n− drift layer 1, an n field stop (FS) layer 10 is provided on a rear side of the n− semiconductor substrate. The n FS layer 10 is provided in the IGBT region 21 and the FWD region 22. Further, the n FS layer 10 contacts the p+ collector region 11 and the n+ cathode region 12 provided on the rear side of the n− semiconductor substrate. The n FS layer 10 has a function of suppressing a depletion layer that spreads from a pn junction between the n− drift layer 1 and the p base layer 2 in the OFF state from reaching the p+ collector region 11.

Further, in the n− drift layer 1, crystal defects are formed on the front surface side of the n− semiconductor substrate as lifetime killers by, for example, added helium (He+), forming a region (hereinafter, short-lifetime region) 1a having a shorter carrier lifetime than other regions. In then FS layer 10 as well, a short-lifetime region 10a is provided. The short-lifetime regions 1a, 10a (portions indicated by hatching) are provided having predetermined thicknesses in the IGBT region 21 and the FWD region 22.

In the rear side of the n− semiconductor substrate, the p+ collector region 11 is provided in the IGBT region 21.

Further, in the rear side of the n⁻ semiconductor substrate, the n⁺ cathode region 12 is provided in the FWD region 22. The p⁺ collector region 11 and the n⁺ cathode region 12 are parallel in the trench lateral direction. The p⁺ collector region 11 faces, across the n⁻ drift layer 1, the IGBT emitter region 31 and a portion of the FWD anode region 32 nearest the IGBT emitter region 31. The n⁺ cathode region 12 faces the FWD anode region 32 across the n⁻ drift layer 1. A collector electrode 13 also serves as a cathode electrode and contacts the p⁺ collector region 11 and the n⁺ cathode region 12.

A portion of the n⁺ cathode region 12 nearest the IGBT region 21 is separated farther than the portion of the FWD anode region 32 nearest the IGBT region 21 from the IGBT emitter region 31 in a direction away from the IGBT emitter region 31. In other words, a width (hereinafter, lateral width) $L_{12}$ of the n⁺ cathode region 12 in the trench lateral direction is narrower than a lateral width $L_{32}$ of the FWD anode region 32. Further, a width $L_{11}$ of the p⁺ collector region 11 in the trench lateral direction is wider than a lateral width $L_{31}$ of the IGBT emitter region 31 by the amount that the lateral width $L_{12}$ of the n⁺ cathode region 12 is narrower than the lateral width $L_{32}$ of the FWD anode region 32.

The difference $\Delta L_1$ (=$L_{32}$–$L_{12}$) of the lateral width $L_{32}$ of the FWD anode region 32 and the lateral width $L_{12}$ of the n⁺ cathode region 12 may be 50 µm or more ($L_{32}$–$L_{12}$≥50 µm). The lateral width $L_{12}$ of the n⁺ cathode region 12 may be, for example, 100 µm or more. The lateral width $L_{32}$ of the FWD anode region 32 may be, for example, 150 µm or more. In particular, the IGBT region 21 is arranged on each side of the FWD region 22 in the trench lateral direction whereby both ends of the n⁺ cathode region 12 in the trench lateral direction are each separate from the opposing IGBT emitter region 31 of the IGBT region 21 in a direction away from the IGBT emitter region 31.

Therefore, a sum of a first horizontal distance from each end of the n+cathode region 12 to the opposing IGBT emitter region 31 of the IGBT region 21 in the trench lateral direction is the difference $\Delta L_1$. For example, the first horizontal distance $\Delta L_{1a}$ of one end of the n⁺ cathode region 12 in the trench lateral direction may be substantially equal to the first horizontal distance $\Delta L_{1b}$ of the other end of n⁺ cathode region 12 in the trench lateral direction ($\Delta L_{1a}$=$\Delta L_{1b}$=$\Delta L_1$/2). The first horizontal distances $\Delta L_{1a}$, $\Delta L_{1b}$ may be a distance that has the greatest possibility of suppressing the gate voltage dependency during operation of the FWD. In particular, the first horizontal distances $\Delta L_{1a}$, $\Delta L_{1b}$ (one end adjacent to the FWD region 22 and the other end thereof, for example, may be 25 µm or more. A horizontal distance is a distance in a direction parallel to a main surface of the n⁻ semiconductor substrate.

Further, an end of the n⁺ cathode region 12 in the trench longitudinal direction is closer than an end of the FWD anode region 32 in the trench longitudinal direction to a center of the FWD region 22. In other words, the end of the n⁺ cathode region 12 in the trench longitudinal direction is positioned closer to a central portion of the n⁻ semiconductor substrate than a side surface of the n⁻ semiconductor substrate. A second horizontal distance $\Delta L_2$ from the end of the n⁺ cathode region 12 in the trench longitudinal direction to an end of the FWD anode region 32 in the trench longitudinal direction is desirably a distance by which a p⁺ region such as a guard ring constituting the edge termination region does not function when the FWD operates. The n⁺ cathode region 12 may satisfy the first and second horizontal distances $\Delta L_{1a}$, $\Delta L_{1b}$, $\Delta L_2$ and a surface area of the n⁺ cathode region 12 may be 50% or less of a surface area of the FWD anode region 32. A surface area is a surface area of a plane parallel to the main surface of the n⁻ semiconductor substrate.

Figure 3:
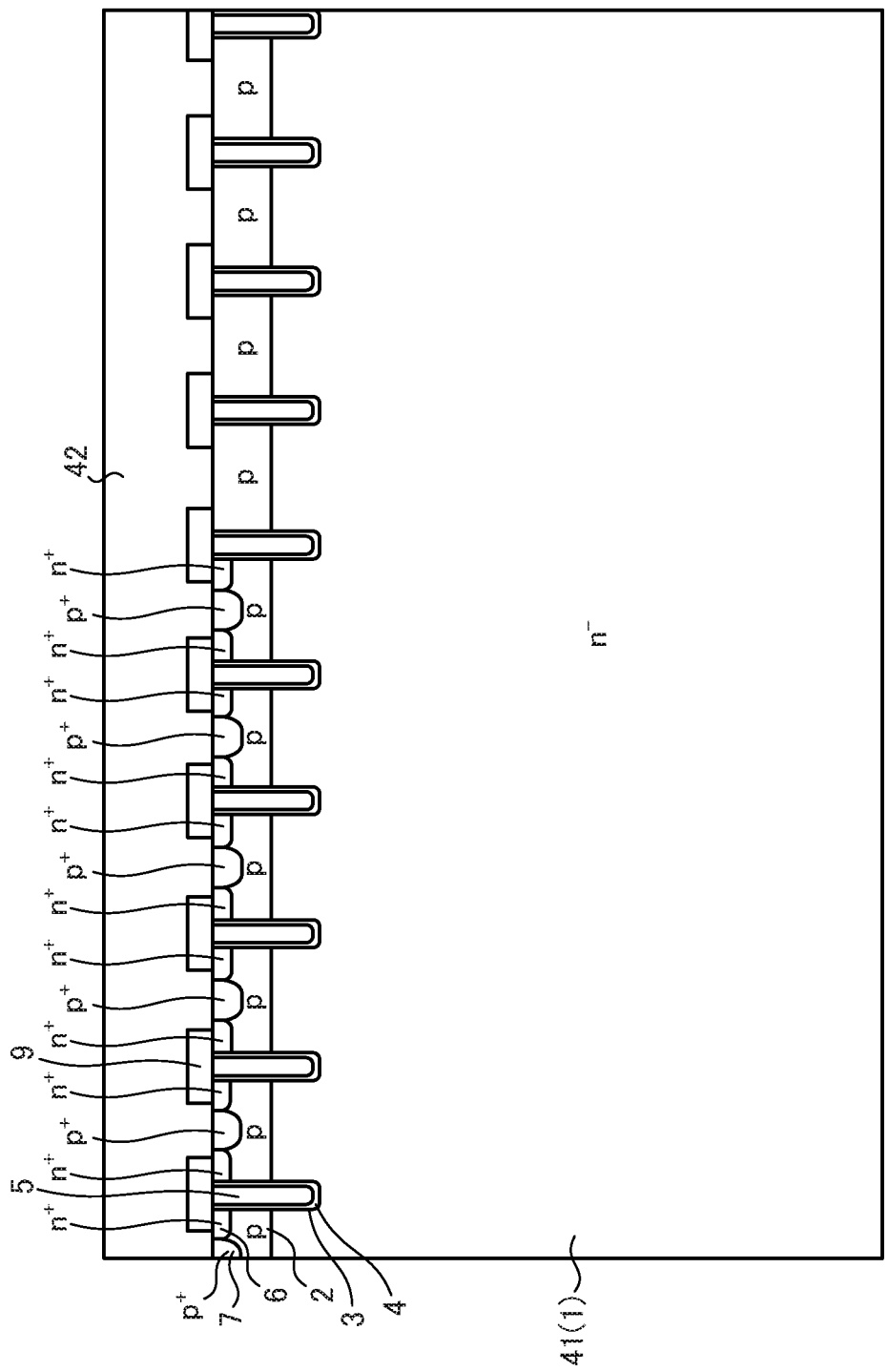
FIGS. 3, 4, 5, 6, 7, 8, 9, and 10 are cross-sectional views of the semiconductor device according to the embodiment during manufacture.

The method of manufacturing the semiconductor device according to the embodiment is described, taking as an example, a case in which 1200V RC-IGBT for a rated current of 400 A is manufactured. FIGS. 3, 4, 5, 6, 7, 8, 9 and 10 are cross-sectional views of the semiconductor device according to the embodiment during manufacture. First, as depicted in FIG. 3, a 6-inch diameter silicon substrate (hereinafter, Si substrate) 41 having a thickness t of 650 µm is prepared by, for example, a floating zone (FZ) method. Resistivity of the Si substrate 41 is about 40 Ωcm to 80 Ωcm when the breakdown voltage is 1200V and therefore, for example, may be 55 Ωcm.

Figure 4:
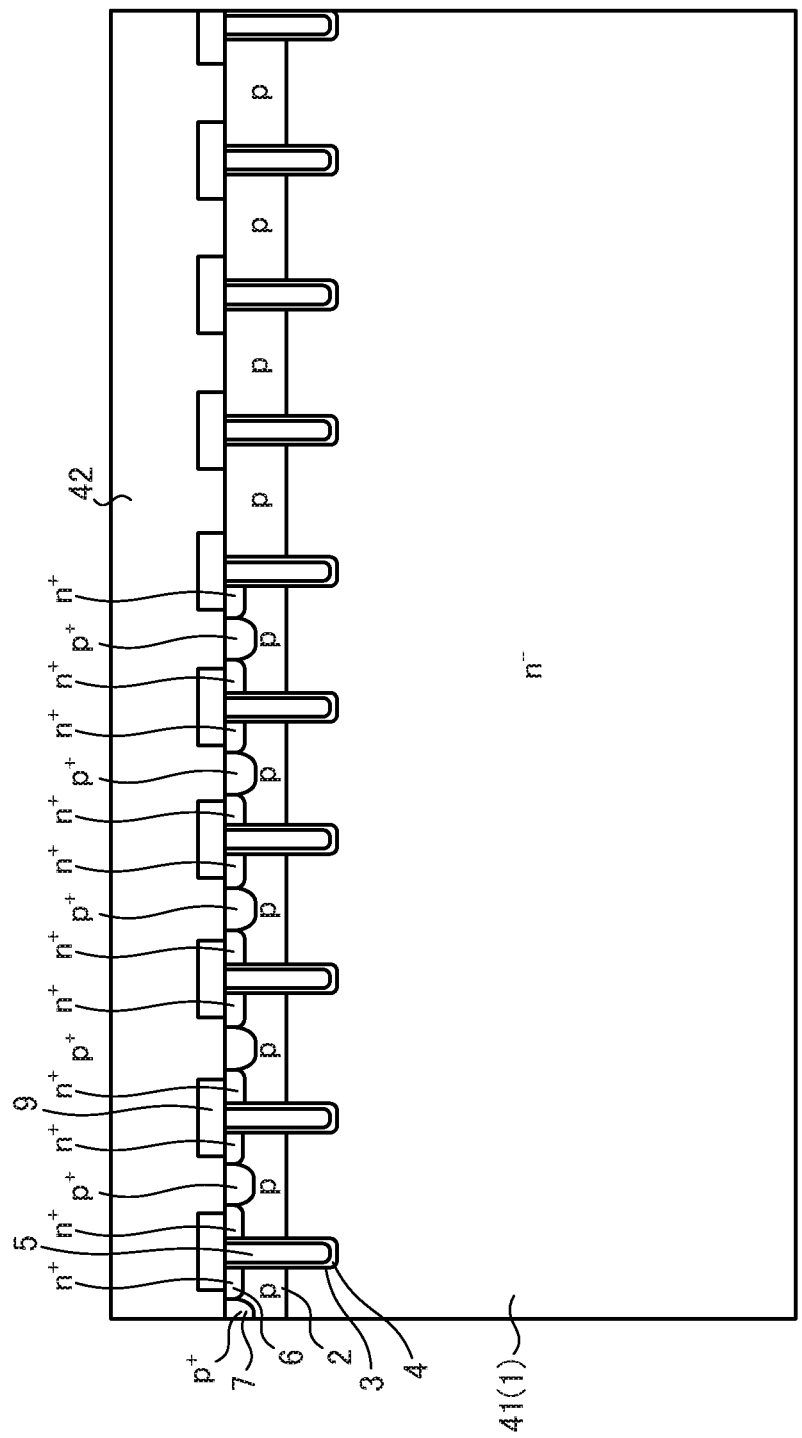

Next, by an ordinary method, in a front surface of the Si substrate 41 that becomes the n⁻ drift layer 1, the trench-gate-type MOS gate structure 20 (the p base layer 2, the trenches 3, the gate oxide films 4, the gate electrodes 5, the n⁺ emitter regions 6, the p⁺ contact regions 7, and the interlayer insulating film 9) are formed. At this time, in the FWD anode region 32, the n⁺ emitter regions 6 and the p⁺ contact regions 7 are not formed. Next, the front surface of the Si substrate 41 is protected by a resist 42. Next, as depicted in FIG. 4, a rear surface of the Si substrate 41 is ground, reducing the thickness t of the Si substrate 41 to, for example, 125 µm. Next, the rear surface of the Si substrate 41 is etched, removing a grinding distortion layer (not depicted) on the rear surface of the Si substrate 41.

Figure 5:
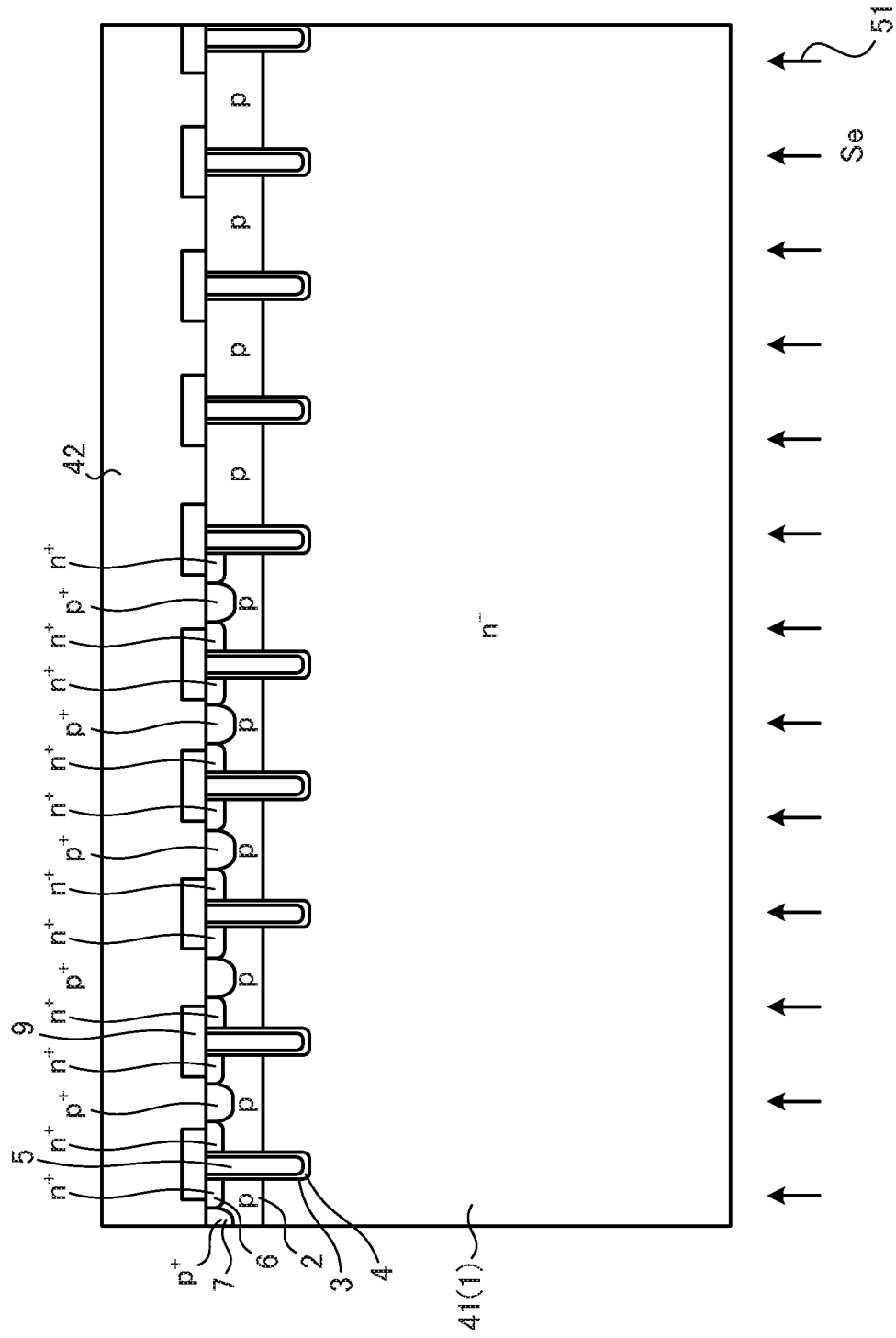
Figure 6:
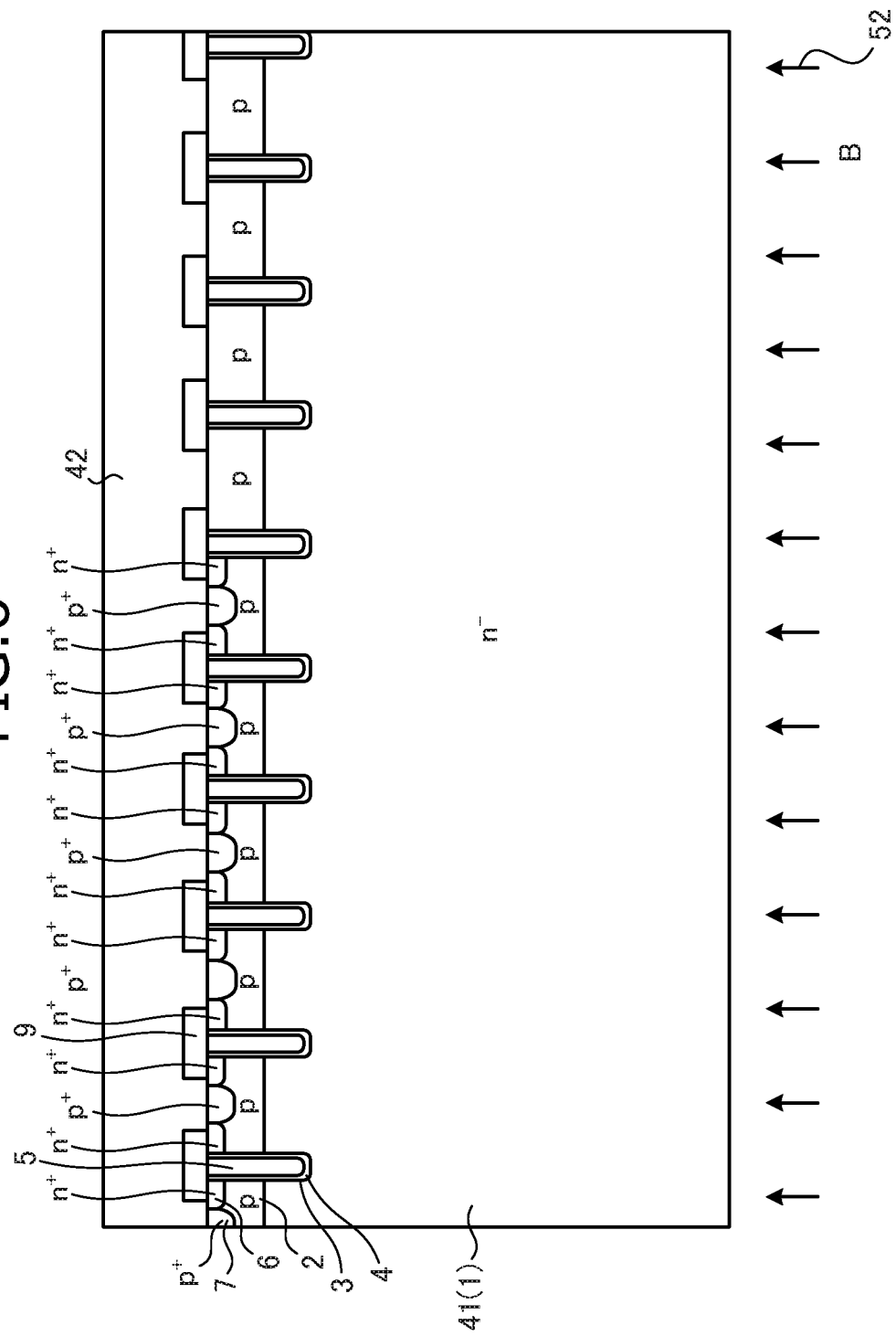

Next, as depicted in FIG. 5, for example, a first ion implantation 51 is performed of implanting an n-type impurity such as, for example, selenium (Se) in the entire ground rear surface of the Si substrate 41, at a dose of $3\times10^{14}$/cm² by an acceleration energy of 100 keV. Since the impurity implanted by the first ion implantation 51 is selenium having a relatively large diffusion coefficient, the n FS layer 10 may be formed by a deep diffusion layer, facilitating improvement of the RC-IGBT yield rate. Next, as depicted FIG. 6, for example, a second ion implantation 52 is performed of implanting a p-type impurity such as, for example, boron (B), in the entire ground rear surface of the Si substrate 41, at a dose of $8\times10^{13}$/cm² by an acceleration energy of 40 keV. The second ion implantation 52 is ion implantation for forming the p⁺ collector region 11.

Figure 7:
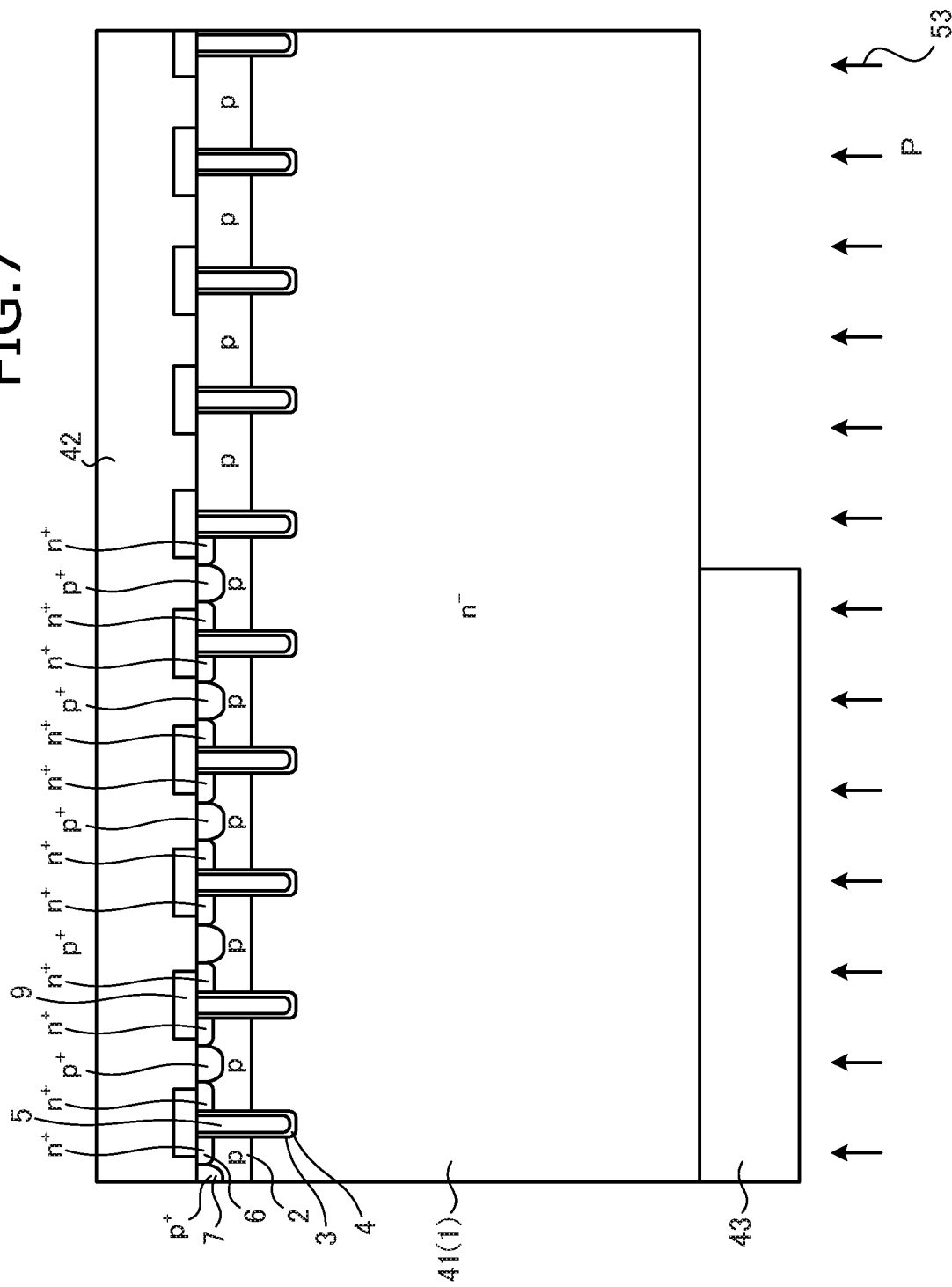

Next, as depicted in FIG. 7, a resist 43 having, for example, a thickness of 2 µm is applied to the rear surface of the Si substrate 41. Next, for example, using aligners of both surfaces, a pattern of the n⁺ cathode region 12 is projected on the resist 43 and subsequently the resist 43 is patterned by photolithography, exposing a portion corresponding to a formation region of the n⁺ cathode region 12. At this time, the resist 43 is patterned so as to satisfy the first and second horizontal distances $\Delta L_{1a}$, $\Delta L_{1b}$, $\Delta L_2$. Next, a third ion implantation 53 is performed using the resist 43 as a mask. The third ion implantation 53 includes implanting an n-type impurity such as, for example, phosphorus (P) in the rear surface of the Si substrate 41, for example, at a dose of $2\times10^{15}$/cm² by an acceleration energy of 110 keV. The third ion implantation 53 is ion implantation for forming the n⁺ cathode region 12.

Figure 8:
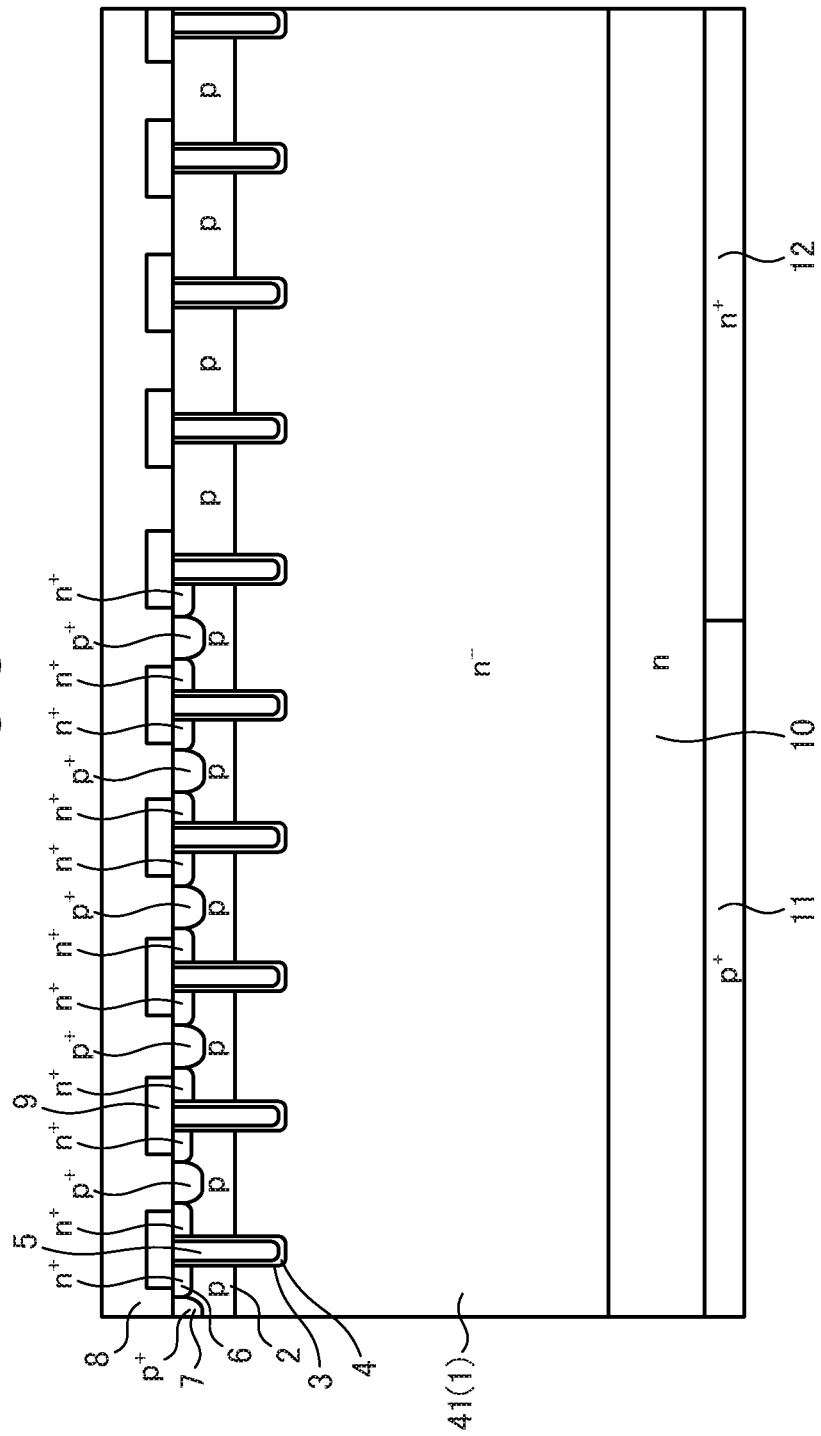

Next, as depicted in FIG. 8, the resist 42 of the front surface of the Si substrate 41 and the resist 43 of the rear surface of the Si substrate 41 are peeled. Next, for example, annealing is performed at a temperature of 950 degrees C. for 30 minutes whereby the impurities implanted by the first to third ion implantations 51 to 53 are activated. As a result, in a rear side of the Si substrate 41, the n FS layer 10, the $p^+$ collector region 11, and the $n^+$ cathode region 12 are formed. Next, on the front surface of the Si substrate 41, for example, an aluminum silicon (Al—Si) film having a thickness of 5 μm is deposited and the aluminum silicon film is patterned by photolithography, forming the emitter electrode 8.

Figure 9:
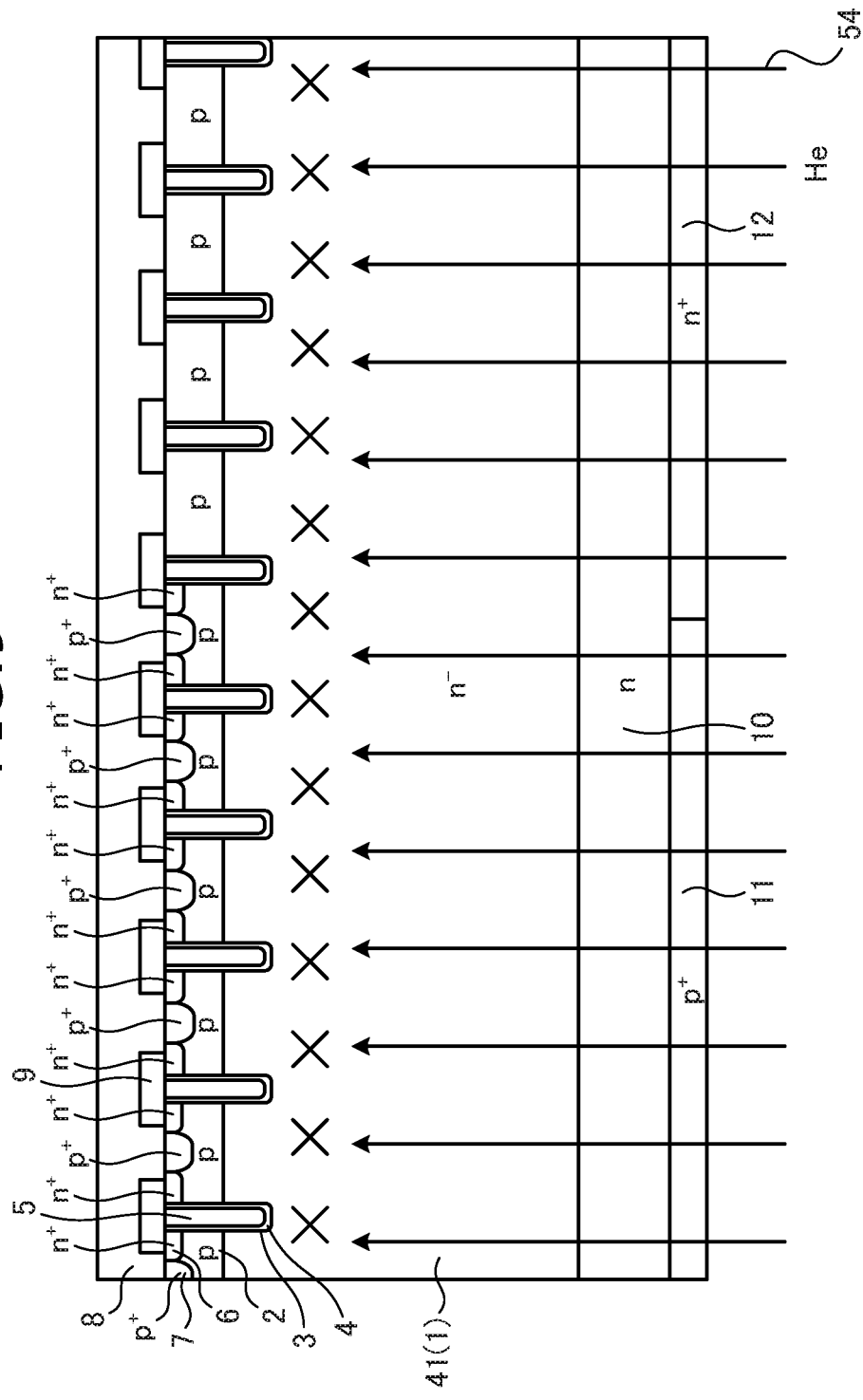

Next, as depicted in FIG. 9, a first helium irradiation 54 is performed of irradiating helium onto the entire rear surface of the Si substrate 41 from the rear surface of the Si substrate 41 by a predetermined range to thereby form a defect layer (the short-lifetime region 1a in FIG. 2) in the $n^-$ drift layer 1 toward the front surface of the Si substrate 41. An acceleration energy of the first helium irradiation 54 may be, for example, 23 MeV. A dose of the first helium irradiation 54 may be, for example, about $1 \times 10^{13}/cm^2$. In FIG. 9, x's in the $n^-$ drift layer 1 represent crystal defects formed by the first helium irradiation 54 (similarly in FIG. 10).

Figure 10:
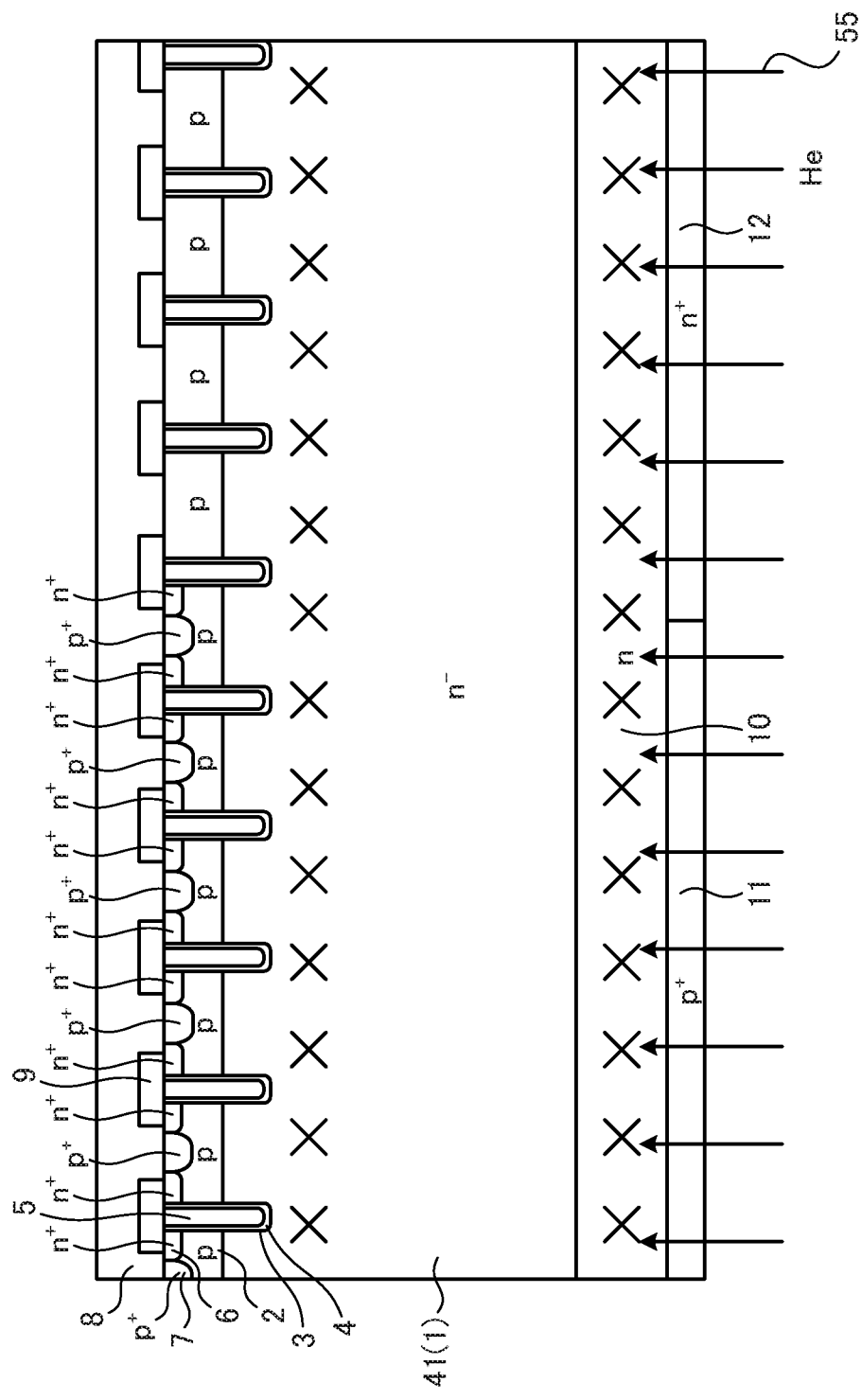

Next, as depicted in FIG. 10, a second helium irradiation 55 is performed of irradiating helium onto the entire rear surface of the Si substrate 41 from the rear surface of the Si substrate 41 by predetermined range to thereby form a defect layer (the short-lifetime region 10a in FIG. 2) in then FS layer 10. An acceleration energy of the second helium irradiation 55 is lower than the acceleration energy of the first helium irradiation 54. In FIG. 10, x's in the n FS layer 10 represent crystal defects formed by the second helium irradiation 55. A dose of the second helium irradiation 55 may be, for example, about $1 \times 10^{13}/cm^2$.

An irradiation sequence of the first and second helium irradiations 54, 55 is not limited to that described and may be variously changed. For example, the first helium irradiation 54 may be performed after the second helium irradiation 55. Further, the number of sessions of the first and second helium irradiations 54, 55 may be variously changed. For example, the first and second helium irradiations 54, 55 may be performed 1 time each, or 2 or more times each. Further, when the first and second helium irradiations 54, 55 are each performed multiple times, the first and second helium irradiations 54, 55 may be alternately performed.

Next, for example, annealing at a temperature of 370 degrees C. is performed for 1 hour whereby the defect density of the crystal defects generated in the $n^-$ drift layer 1 and the n FS layer 10 by the first and second helium irradiations 54, 55 is reduced. Thereafter, on the rear surface of the Si substrate 41, for example, aluminum (Al), titanium (Ti), nickel (Ni), and gold (Au) are sequentially deposited to have thickness of, for example, 1 μm, 0.07 μm, 1 μm, and 0.3 μm, respectively, forming the collector electrode 13 common to the IGBT region 21 and the FWD region 22. Thus, the RC-IGBT having the FS structure depicted in FIGS. 1 and 2 is completed.

Figure 11:
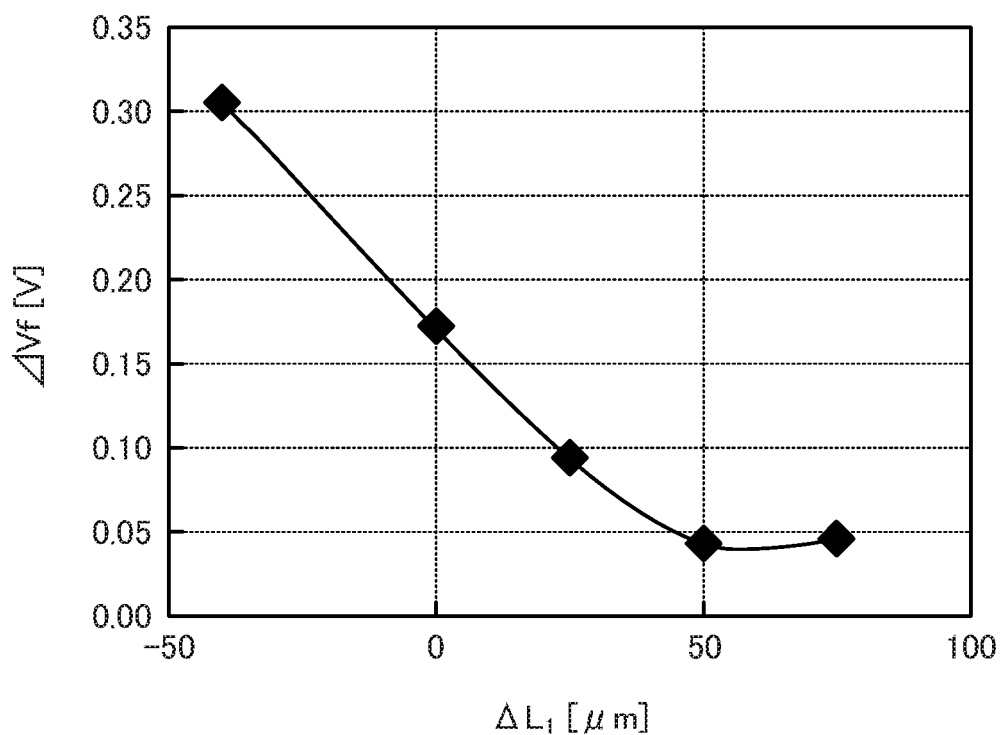
FIG. 11 is a characteristics diagram of forward voltage drop characteristics of the semiconductor device according to the embodiment.

Forward voltage drop characteristics of the semiconductor device according to the embodiment were verified. FIG. 11 is a characteristics diagram of forward voltage drop characteristics of the semiconductor device according to the embodiment. Plural RC-IGBTs in which the differences $\Delta L_1$ of the lateral width $L_{32}$ of the FWD anode region 32 and the lateral width $L_{12}$ of the $n^+$ cathode region 12 differ were produced according to the described method of manufacturing the semiconductor device according to the embodiment. In particular, the lateral width $L_{12}$ of the $n^+$ cathode region 12 was set to 100 μm while the lateral width $L_{32}$ of the FWD anode region 32 was varied.

In each sample, forward voltage drop of the FWD when gate voltage is applied to the IGBT and forward voltage drop of the FWD when gate voltage is not applied to the IGBT were measured, the difference (hereinafter, simply, forward voltage drop difference) $\Delta Vf$ of the forward voltage drops was calculated. The results are shown in FIG. 11. "When gate voltage is applied" indicates a state when the gate is ON, i.e., is when the gate voltage becomes higher than a threshold (Vth) of the MOS gate and in the surface on the MOS gate side of the p base layer 2, an n-type inversion layer (n channel) is formed. In FIG. 11, $\Delta L_1=0$ is a case in which the lateral width $L_{32}$ of the FWD anode region 32 and the lateral width $L_{12}$ of the $n^+$ cathode region 12 are equal (i.e., the conventional example depicted in FIG. 16). $\Delta L_1<0$ is a case in which the lateral width $L_{12}$ of the $n^+$ cathode region 12 is wider than the lateral width $L_{32}$ of the FWD anode region 32.

From the results shown in FIG. 11, it was confirmed that by making the lateral width $L_{12}$ of the $n^+$ cathode region 12 less than the lateral width $L_{32}$ of the FWD anode region 32 ($\Delta L_1>0$), the forward voltage drop difference $\Delta Vf$ of the FWD may be substantially close to zero. In other words, it was confirmed that even when the IGBT conducts and an inversion layer is formed, operation of the FWD is substantially not adversely affected. It was confirmed that the difference $\Delta L_1$ of the lateral width $L_{32}$ of the FWD anode region 32 and the lateral width $L_{12}$ of the $n^+$ cathode region 12 may be set to 50 μm or more whereby even when the IGBT is in the ON state, increases in the forward voltage drop of the FWD may be reduced to 0.05V or less.

The difference $\Delta L_1$ has to be less than a length $L_{32}$ of the FWD anode region 32 and the FWD anode region 32 has to be operated. In particular, when the difference $\Delta L_1$ is greater than $L_{32}$12, the $n^+$ cathode region 12 becomes smaller whereby electron current concentrates near the $n^+$ cathode region 12, increasing the current density. Therefore, the forward voltage drop Vf of the FWD changes to an increase. As a result, the difference $\Delta L_1$ may be less than one half of the length $L_{32}$ of the FWD anode region 32.

Figure 17:
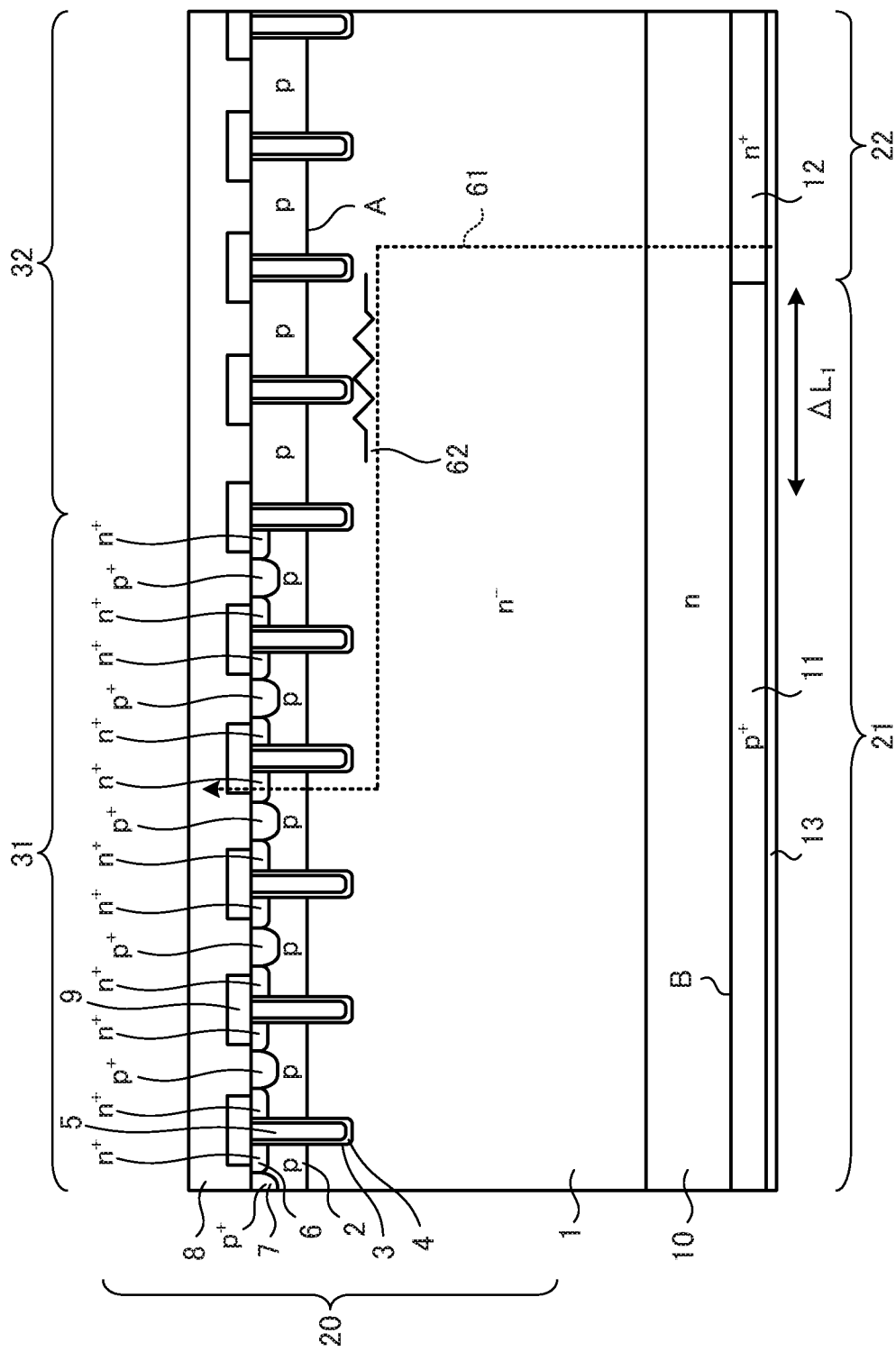
FIG. 17 is a diagram depicting a path of electron flow in a RC-IGBT having a FS structure according to the embodiment.

The reason for this as follows. FIG. 17 is a diagram depicting a path of electron flow in the RC-IGBT having the FS structure according to the embodiment. In FIG. 17, the short-lifetime regions 1a, 10a are not depicted. The lateral width $L_{32}$ of the FWD anode region 32 is made wider than the lateral width $L_{12}$ of the $n^+$ cathode region 12 whereby when the IGBT is in the ON state, the electrons injected from the $n^+$ cathode region 12 pass through the $n^-$ drift layer 1 having a high resistance, along a pn junction (pn junction A) of the p anode layer and the $n^-$ drift layer 1, flow into an n-type inversion layer (n channel, not depicted) of the IGBT, pass through the $n^+$ emitter region 6, and exit from the emitter electrode 8 (arrow indicated by reference numeral 61 in FIG. 17). In other words, electrons have to flow through the $n^-$ drift layer 1 along the pn junction A of a region corresponding to the difference $\Delta L_1$. The path of the electrons is the $n^-$ drift layer 1, which has a high resistance, and therefore, this resistance (resistance symbol indicated by reference numeral 62 in FIG. 17) is sufficiently high. Therefore, a sufficient potential difference occurs between the pn junction A due to the voltage drop whereby a potential of the p anode layer easily becomes a built-in voltage (~0.7V) or higher.

Figure 12:
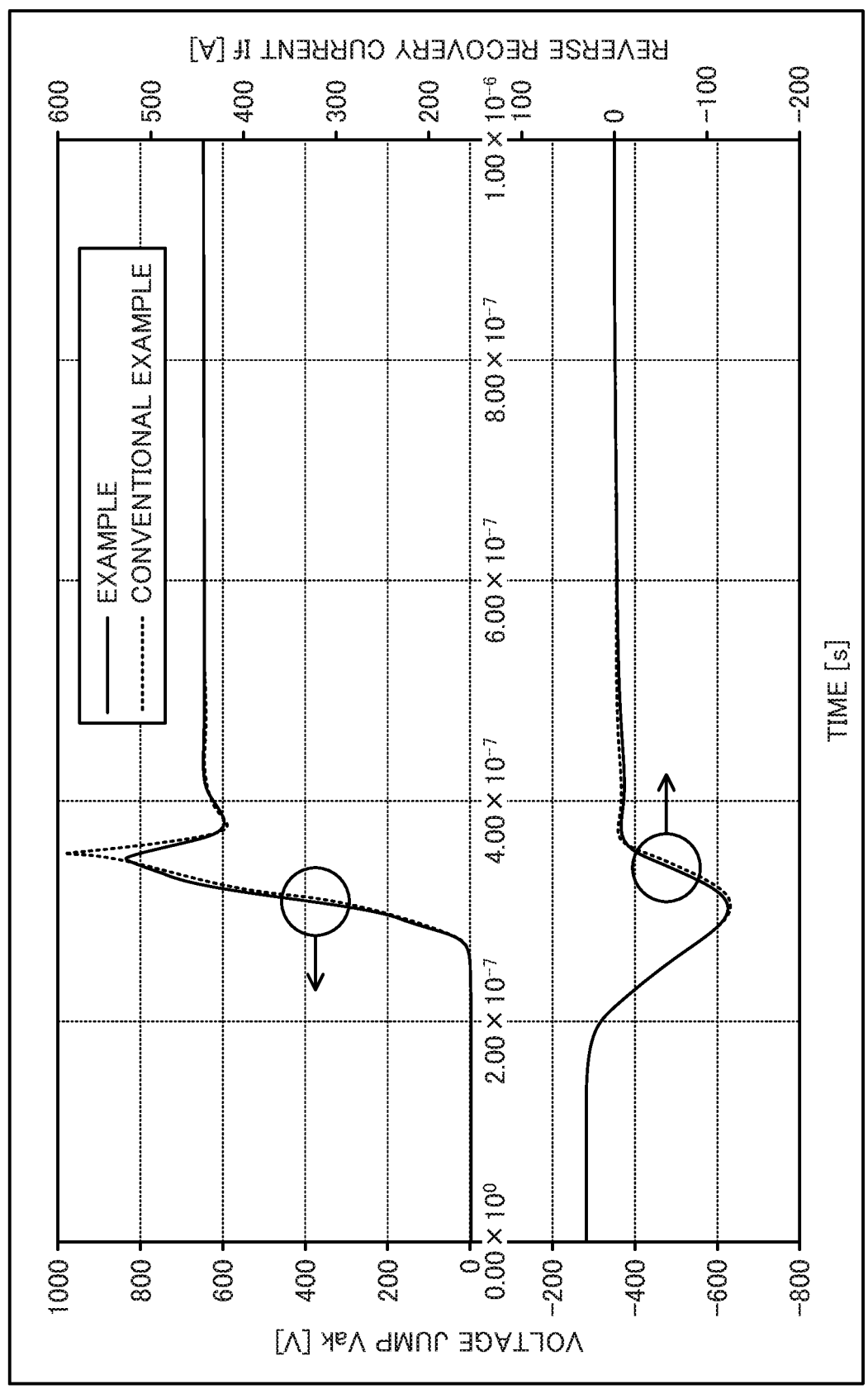
FIG. 12 is a characteristics diagram of a reverse recovery waveform of the semiconductor device according to the embodiment.

Reverse recovery characteristics of the semiconductor device according to the embodiment were verified. FIG. 12 is a characteristics diagram of a reverse recovery waveform of the semiconductor device according to the embodiment. A RC-IGBT (example) was produced according to the above method of manufacturing the semiconductor device according to the embodiment and the reverse recovery waveform of this RC-IGBT was measured. The results are shown in FIG. 12. FIG. 12 further shows a reverse recovery waveform of a RC-IGBT in which the lateral width $L_{32}$ of the FWD anode region 32 and the lateral width $L_{12}$ of the n+ cathode region 12 were equal (i.e., the conventional example depicted in FIG. 16).

From the results shown in FIG. 12, it was confirmed that in the example, a peak of reverse recovery current If and a peak of voltage jump Vak due to oscillation were reduced to be less than those of the conventional example. The reason for this is as follows. In the example, the $p^+$ collector region 11 and the FWD anode region 32 partially face each other across the $n^-$ drift layer 1. In this region where the $p^+$ collector region 11 and the FWD anode region 32 partially face each other, electrons accumulated near the $n^-$ drift layer 1 adjacent to the $p^+$ collector region 11 flow along a pn junction (a pn junction of the $p^+$ collector region 11 and the n FS layer 10, hereinafter, pn junction B) of the $p^+$ collector region 11 and the $n^-$ drift layer 1, toward the $n^+$ cathode region 12. Voltage drop occurs along the path along which the electrons travel and therefore, when the difference $\Delta L_1$ is a certain length, the voltage drop easily exceeds a built-in voltage of the pn junction B. In other words, during reverse recovery, injection of holes from the $p^+$ collector region 11 to the $n^-$ drift layer 1 progresses in the FWD region 22 as a result of the difference $\Delta L_1$. Thus, carrier depletion in the $n^+$ cathode region 12 of the $n^-$ drift layer 1 may be prevented.

Figure 13:
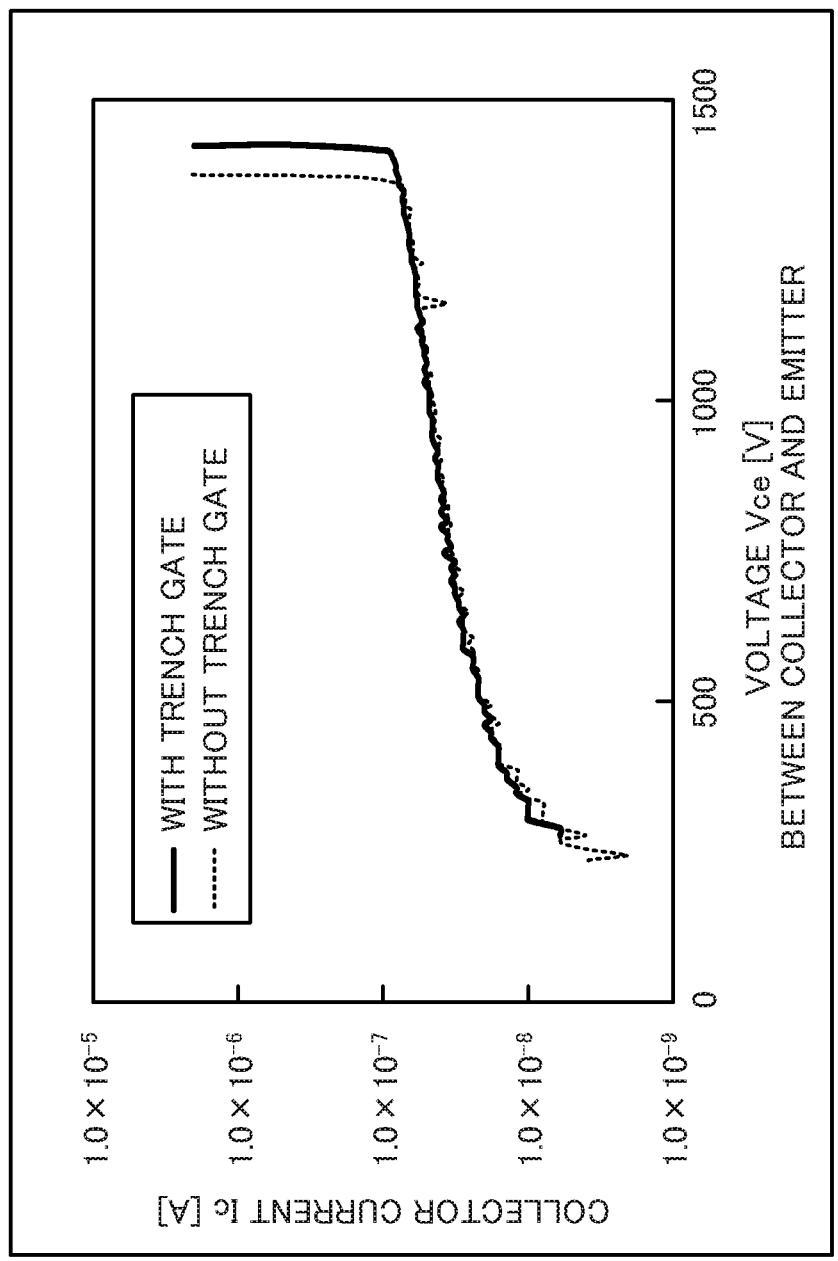
FIG. 13 is a characteristics diagram of current/voltage characteristics due to the present/absence of a trench gate in a FWD region.

The relationship of the presence/absence of the trench gate of the FWD region 22 and element breakdown voltage was verified. FIG. 13 is a characteristics diagram of current/voltage characteristics due to the present/absence of the trench gate in the FWD region. FIG. 13 shows measurement results of the element breakdown voltage when the trench gate is provided in the FWD region 22 (with trench gate) and when the trench gate is not provided in the FWD region (no trench gate). Here, "with trench gate" is the example described above and "no trench gate" is the same as the example described above aside from the trench gate not being provided in the FWD region (similarly in FIG. 14).

From the results shown in FIG. 13, it was confirmed that "with trench gate" had a higher breakdown voltage (voltage Vce between the collector and emitter leading to breakdown) than "without trench gate" and by providing the trench gate (the trenches 3, the gate oxides film 4, and the gate electrodes 5) in the FWD region 22, decreases in the breakdown voltage were suppressed.

Figure 14:
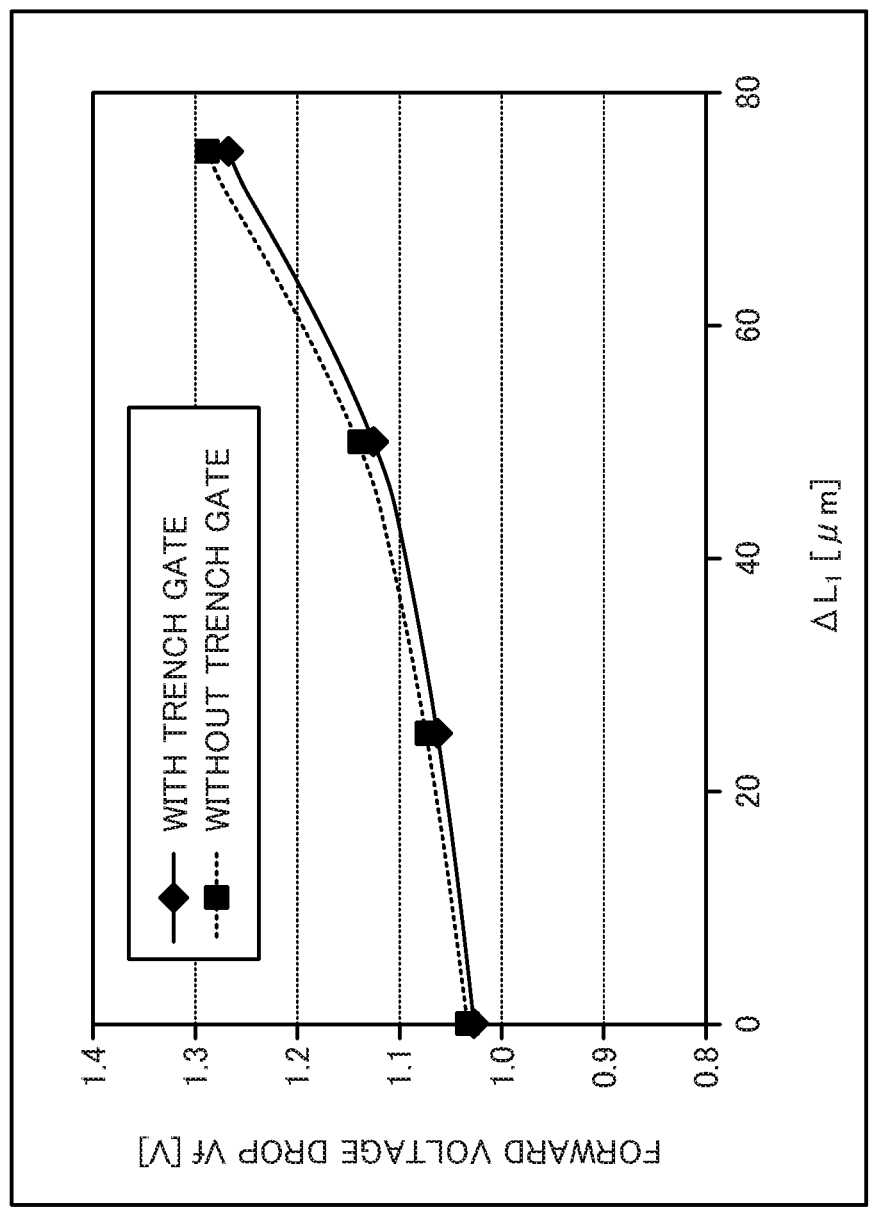
FIG. 14 is a characteristics diagram of forward voltage drop characteristics due to the presence/absence of the trench gate in the FWD region of the semiconductor device according to the embodiment.

The relationship of the presence/absence of the trench gate of the FWD region 22 and the forward voltage drop characteristics of the FWD was verified. FIG. 14 is a characteristics diagram of forward voltage drop characteristics due to the presence/absence of the trench gate in the FWD region of the semiconductor device according to the embodiment. In cases in which the trench gate is provided in the FWD region 22 (with trench gate) and in which the trench gate is not provided in the FWD region (without trench gate), the forward voltage drop of the FWD was measured with respect to the difference $\Delta L_1$ of the lateral width $L_{32}$ of the FWD anode region 32 and the lateral width $L_{12}$ of the n+cathode region 12. The results are shown in FIG. 14.

From the results shown in FIG. 14, in the case of "with trench gate", it was confirmed that the forward voltage drop Vf of the FWD may be reduced irrespective of the difference $\Delta L_1$ of the lateral width $L_{32}$ of the FWD anode region 32 and the lateral width $L_{12}$ of the $n^+$ cathode region 12. Thus, it was confirmed that by providing the trench gate (the trenches 3, the gate oxide films 4, and the gate electrodes 5) in the FWD region 22, the forward voltage drop Vf of the FWD decreases and FWD easily turns ON.

As described, according to the embodiment, making the lateral width of the $n^+$ cathode region less than the lateral width of the FWD anode region facilitates accumulation of electrons injected from the $n^+$ cathode region to the $n^-$ drift layer at the pn junction of the p anode layer and the $n^-$ drift layer. As a result, a potential difference equal to or higher than the built-in voltage may be cause to occur between the pn junction of the p anode layer and the $n^-$ drift layer. Further, application of the gate voltage to the IGBT may suppress adverse effects on the forward voltage drop characteristics of the FWD, enabling the forward voltage drop of the FWD to be reduced as compared to a conventional device.

Further, according to the embodiment, the lateral width of the FWD anode region is made wider than the lateral width of the $n^+$ cathode region, enabling the lateral width of the $p^+$ collector region to be made wider than the lateral width of the IGBT emitter region. As a result, element performance of the IGBT may be maintained. Therefore, the forward voltage drop of the FWD may be reduced while increases in the ON voltage of the IGBT may be suppressed.

According to the embodiment, the lateral width of the $n^+$ cathode region is made smaller than the lateral width of the FWD anode region whereby hole injection progresses to the $n^-$ drift layer from a portion of the $p^+$ collector region facing the FWD anode region across the $n^-$ drift layer. As a result, carrier density on the $n^+$ cathode region side of the $n^-$ drift layer increases whereby the forward voltage drop of the FWD may be reduced, facilitating turn ON of the FWD. Therefore, soft recovery (reduction of the peak of the reverse recovery current If) during reverse recovery of the FWD and suppression (reduction of the peak of the voltage jump Vak) of waveform oscillation may be realized. Further, according to the embodiment, the trench gate is provided in the FWD region, facilitating turn ON of the FWD and enabling decreases in the breakdown voltage to be suppressed.

Although the present invention has been described, taking as an example, a high-voltage RC-IGBT having an FS structure using a thin wafer, the present invention is not limited to the embodiments above and various modifications within a scope not departing from the spirit of the invention are possible. For example, in the embodiments above, although the MOS gate structure of the IGBT region is a trench gate type, a planar gate type may be used in place of the trench gate. In addition, although a portion of the p base layer of the MOS gate structure also serves as the p anode layer of the FWD, configuration may be such that in the surface layer on the front surface of the $n^-$ semiconductor substrate, the p base layer of the MOS gate structure and the p anode layer of the FWD are each selectively provided. Further, in the embodiments, although a first conductivity type is an n-type and a second conductivity type is a p-type, the present invention is similarly implemented when the first conductivity type is a p-type and the second conductivity type is an n-type.

According to the present invention, the lateral width of the $n^+$ cathode region is made narrower than the lateral width of the FWD anode region whereby the following effects are achieved. Electrons injected into the $n^-$ drift layer from the $n^+$ cathode region when the gate is ON cannot reach the n-type inversion layer (n channel) formed on the gate side surface, when passing through the $n^-$ drift layer, along the pn junction of the p anode layer and the $n^-$ drift layer in the FWD region. Since the $n^-$ drift layer is a region of high resistance, for example, 10 Ωcm or higher, voltage drop on the path traveled by electrons may be set to be a potential difference that is the built-in voltage between the pn junction or higher. As a result, the injection of holes from the p anode layer may be facilitated, enabling an occurrence of snapping (jumping) of the I-V curve to be prevented. In other words, by applying the gate voltage to the IGBT, an effect is achieved in that adverse effects on the forward voltage drop characteristics of the FWD are suppressed.

Further, according to the present invention, the lateral width of the FWD anode region is made to be wider than the lateral width of the $n^+$ cathode region whereby the lateral width of the $p^+$ collector region may be made to be wider than the lateral width of the IGBT emitter region (base layer having an emitter region). As a result, element performance of the IGBT may be maintained. Therefore, the forward voltage drop of the FWD may be reduced and increases in the ON voltage of the IGBT may be suppressed.

Further, according to the present invention, the lateral width of the n+cathode region is made to be narrower than the lateral width of the FWD anode region whereby hole injection to the $n^-$ drift layer from a portion of the $p^+$ collector region facing the FWD anode region across the $n^-$ drift layer is caused to progress. As a result, the carrier density on the $n^+$ cathode region side of the $n^-$ drift layer increases, enabling the forward voltage drop of the FWD to be reduced thereby facilitating turn ON of the FWD. Further, according to the embodiments, the trench gate (second insulated gate region) is provided in the FWD region (freewheeling diode portion), enabling turn ON of the FWD to be facilitated and decreases in the breakdown voltage to be suppressed.

According to the semiconductor device of the present invention, effects are achieved in that a semiconductor device may be provided that has soft recovery characteristics and that suppresses waveform oscillation at the time of reverse recovery while reducing the forward voltage drop in a state in which the ON voltage is maintained.

As described, the semiconductor device according to the present invention is useful for power semiconductor devices used in power converting equipment such as inverters or the like.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
a semiconductor substrate having a drift layer of a first conductivity type;
an insulated-gate bipolar transistor region and a freewheeling diode region on the semiconductor substrate,
wherein the insulated-gate bipolar transistor region includes:
a base layer of a second conductivity type provided on a front surface side of the semiconductor substrate,
an emitter region of the first conductivity type selectively provided in the base layer,
a first insulated gate region including a first gate insulating film and a first gate electrode, provided on the front surface side of the semiconductor substrate,
an emitter electrode electrically connected to both the base layer and the emitter region,
a collector region of the second conductivity type selectively provided in a rear side of the semiconductor substrate, and
a collector electrode electrically connected to the collector region,
wherein the freewheeling diode region includes:
an anode layer of the second conductivity type provided on the front surface side of the semiconductor substrate, electrically connected to the emitter electrode,
a second insulated gate region including a first trench penetrating the anode layer and reaching the drift layer, a second gate insulating film provided along an inner wall of the first trench, and a second gate electrode provided in the first trench, via a second gate insulating film, and
a cathode region of the first conductivity type provided in the rear side of the semiconductor substrate, electrically connected to the collector electrode,
wherein a first width of the cathode region in a first direction in which the insulated-gate bipolar transistor region and the freewheeling diode region are arranged is narrower than a first width of the anode layer in the first direction, and a second width of the cathode region in a second direction orthogonal to the first direction is narrower than a second width of the anode layer in the second direction, the cathode region being a single continuous region in the first direction,
wherein a surface area of the insulated-gate bipolar transistor region is larger than a surface area of the freewheeling diode region, and
wherein a difference between the first width of the anode layer in the first direction and the first width of the cathode region in the first direction is 50 μm or more.

2. The semiconductor device according to claim 1, wherein the first insulated gate region includes:
a second trench penetrating the base layer and the emitter region, reaching the drift layer,
the first gate insulating film provided along an inner wall of the second trench, and
the first gate electrode provided in the second trench via the first gate insulating film.

3. The semiconductor device according to claim 1, wherein
the anode layer includes a plurality of trenches, including the first trench, and
an edge of the collector region extends past an edge of the anode layer by a width greater than a distance between two adjacent trenches of the plurality of trenches.

* * * * *